US011849653B2

(12) United States Patent
Pesic et al.

(10) Patent No.: US 11,849,653 B2
(45) Date of Patent: *Dec. 19, 2023

(54) CONTROLLING POSITIVE FEEDBACK IN FILAMENTARY

(71) Applicant: Applied Materials, Inc., Santa Clara, CA (US)

(72) Inventors: Milan Pesic, Paoli, PA (US); Luca Larcher, Reggio Emilia (IT); Bastien Beltrando, Marseilles (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/734,634

(22) Filed: May 2, 2022

(65) Prior Publication Data

US 2022/0263022 A1 Aug. 18, 2022

Related U.S. Application Data

(63) Continuation of application No. 16/689,987, filed on Nov. 20, 2019, now Pat. No. 11,322,685.

(51) Int. Cl.
*H10N 70/00* (2023.01)
*G11C 13/00* (2006.01)
*G11C 11/56* (2006.01)
*H10B 63/00* (2023.01)
*H10N 70/20* (2023.01)
*G06N 3/04* (2023.01)

(52) U.S. Cl.
CPC ....... *H10N 70/021* (2023.02); *G11C 11/5685* (2013.01); *G11C 13/003* (2013.01); *H10B 63/20* (2023.02); *H10N 70/24* (2023.02); *H10N 70/826* (2023.02); *H10N 70/841* (2023.02); *H10N 70/8416* (2023.02); *H10N 70/8613* (2023.02); *H10N 70/883* (2023.02); *H10N 70/8833* (2023.02); *G06N 3/04* (2013.01)

(58) Field of Classification Search
CPC ............ H10N 70/8616; H10N 70/883; H10N 70/8833; H10N 70/861; H10N 70/8613; H10N 70/24; H10N 70/826; G11C 11/5685; G11C 13/003; H10B 63/20; H01L 45/1286; H01L 45/1266; H01L 45/145; H01L 45/146

See application file for complete search history.

(56) References Cited

U.S. PATENT DOCUMENTS

| | | |
|---|---|---|
| 8,686,389 B1 | 4/2014 | Wang et al. |
| 9,246,085 B1 | 1/2016 | Wang |
| 9,246,087 B1 | 1/2016 | Wang et al. |
| 11,069,746 B2 | 7/2021 | Yoo |

(Continued)

*Primary Examiner* — Joseph C. Nicely
(74) *Attorney, Agent, or Firm* — Kilpatrick Townsend & Stockton LLP

(57) ABSTRACT

A resistive random-access memory (ReRAM) device may include a thermally engineered layer that is positioned adjacent to an active layer and configured to act as a heat sink during filament formation in response to applied voltages. The thermally engineered layer may act as one of the electrodes on the ReRAM device and may be adjacent to any side of the active layer. The active layer may also include a plurality of individual active layers. Each of the active layers may be associated with a different dielectric constant, such that the middle active layer has a dielectric constant that is significantly higher than the other two surrounding active layers.

19 Claims, 30 Drawing Sheets

(56) References Cited

U.S. PATENT DOCUMENTS

| | | |
|---|---|---|
| 11,322,685 B2 | 5/2022 | Pesic et al. |
| 2012/0225532 A1 | 9/2012 | Hautala et al. |
| 2014/0175356 A1 | 6/2014 | Wang et al. |
| 2017/0352807 A1 | 12/2017 | Ha |
| 2020/0343447 A1 | 10/2020 | Zhang et al. |

# CONTROLLING POSITIVE FEEDBACK IN FILAMENTARY

CROSS-REFERENCE TO RELATED APPLICATIONS

This application is a continuation of U.S. patent application Ser. No. 16/689,987 filed Nov. 20, 2019, entitled "CONTROLLING POSITIVE FEEDBACK IN FILAMENTARY RRAM STRUCTURES," the entire disclosure of which is hereby incorporated by reference.

BACKGROUND

A modern electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

SUMMARY

In some embodiments, a resistive random-access memory (ReRAM) device may include a first electrode comprising a first conductive material and an active layer having including an oxide material and configured to form a conductive filament in the active layer in response to an applied voltage. The device may also include a thermally engineered layer having a thermal conductivity greater than approximately 0.8 W/cmK. The thermally engineered layer may be positioned adjacent to the active layer.

In some embodiments, a ReRAM device may include a first electrode; a first active layer comprising a first material having a first dielectric constant; a second active layer comprising a second material having a second dielectric constant; and a third active layer comprising a third material having a third dielectric constant. The second active layer may be positioned between the first active layer and the third active layer. The device may also include a second electrode. The first active layer, the second active layer, and the third active layer may be positioned between the first electrode and the second electrode.

In some embodiments, a ReRAM device may include a first electrode; a first active layer comprising a first material having a first dielectric constant; a second active layer comprising a second material having a second dielectric con-stant; and a third active layer comprising a third material having a third dielectric constant. The second active layer may be positioned between the first active layer and the third active layer. The device may also include a thermally engineered layer having a thermal conductivity greater than approxi-mately 0.8 W/cmK. The thermally engineered layer may be positioned adjacent to at least one of the first active layer, the second active layer, or the third active layer.

In any embodiments, any of the following features may be implemented in any combination and without limitation. The thermally engineered layer may be positioned between the active layer and the first electrode. The active layer may include a first side that is adjacent to the first electrode, and the active layer may include a second side that is orthogonal to the first side and adjacent to the thermally engineered layer. The thermally engineered layer may be deposited such that it wraps around the active layer. The device may also include a gap between the thermally engineered layer and the first electrode. The thermally engineered layer may be nonconductive. The thermally engineered layer may act as a second electrode on the ReRAM device, such that the active layer may be positioned between the thermally engineered layer and the first electrode. The device may also include a second thermally engineered layer having a second thermal conductivity greater than approximately 0.8 W/cmK, where the thermally engineered layer may be positioned adjacent to a first side of the active layer, and where the second thermally engineered layer may be positioned adjacent to a second side of the active layer. The device may also include a via that passes through the thermally engineered layer to electrically contact the first electrode. The thermally engineered layer may include a cylinder, and the active layer may include a layer wrapped around the cylinder. The second dielectric constant may be higher than the first dielectric constant, and the second dielectric constant may be higher than the third dielectric constant. The first material and the third material may include $Ta_2O_5$. The third material may include $TaO_x$, Ta, Ti, or $TiO_x$. The second material may include a uniform distribution of defects. The thermally engineered layer may be adjacent to each of the first active layer, the second active layer, and the third active layer. The thermally engineered layer may be positioned between the first active layer and the first electrode. The thermally engineered layer may act as a second electrode on the ReRAM device, such that the first active layer, the second active layer, and the third active layer may be positioned between the thermally engineered layer and the first electrode. The thermally engineered layer may wrap around the first active layer, the second active layer, and the third active layer.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components.

DETAILED DESCRIPTION

Described herein are embodiments for a resistive random-access memory (ReRAM) device that may include a thermally engineered layer that is positioned adjacent to an active layer and configured to act as a heat sink during filament formation in response to applied voltages. The thermally engineered layer may act as one of the electrodes on the ReRAM device and may be adjacent to any side of the active layer. The active layer may also include a plurality of individual active layers. Each of the active layers may be associated with a different dielectric constant, such that the middle active layer has a dielectric constant that is significantly higher than the other two surrounding active layers.

Figure 1:
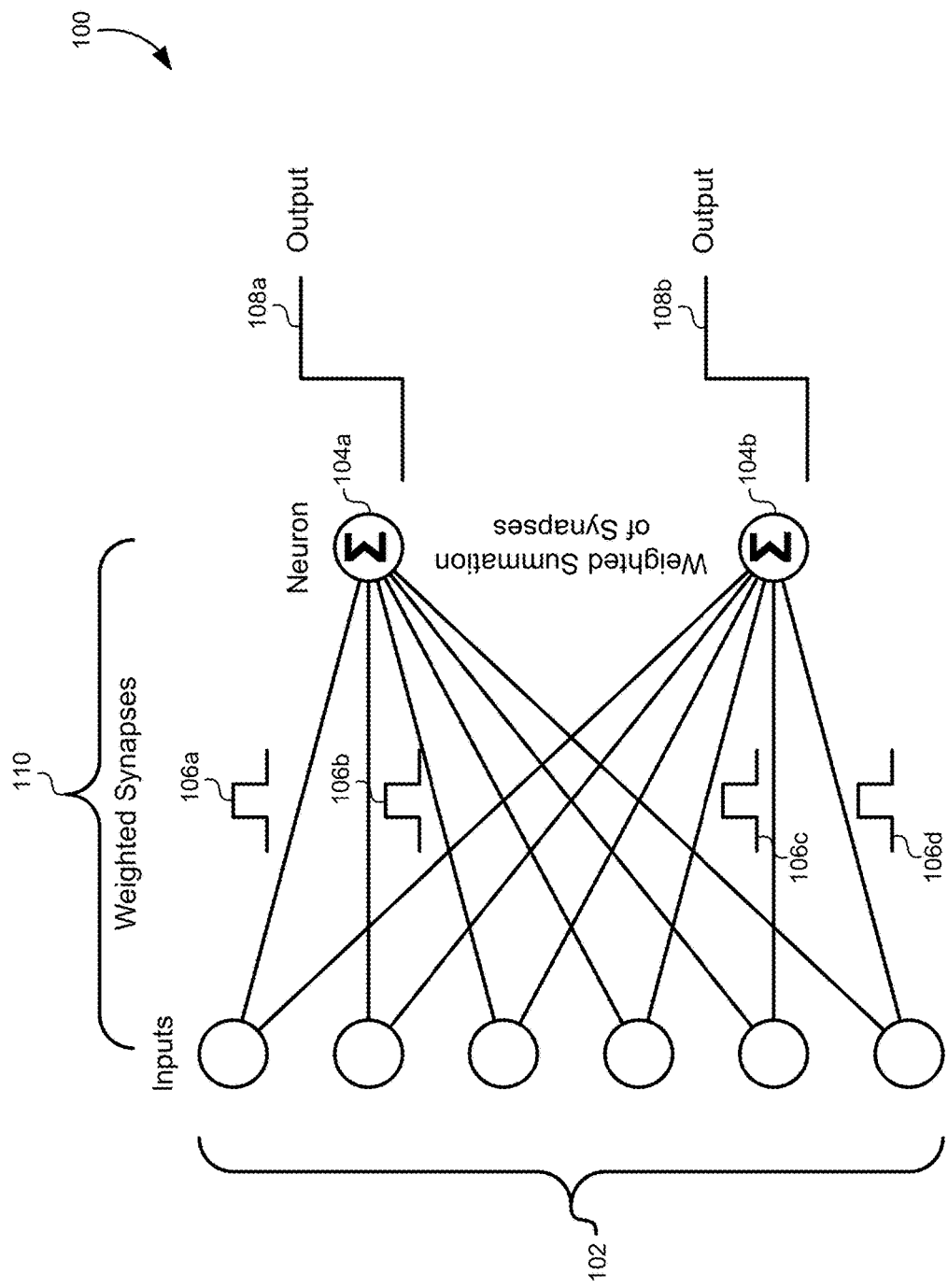
FIG. 1 illustrates a diagram of a portion of a neural network, according to some embodiments.

FIG. 1 illustrates a diagram of a portion of a neural network 100, according to some embodiments. The neural network 100 includes a plurality of inputs 102. The inputs may correspond to an input in a biological system, such as an axon representing a nerve fiber or a long slender projection of a neuron that conducts electrical impulses and acts as a transmission line in the nervous system. For example, the plurality of inputs 102 may represent axons tied to respective photoreceptors used to encode received light in the surrounding environment and transmit an electrical signal representing the received light. The electrical signal may be scaled to represent a magnitude or intensity of a received signal. For example, the plurality of inputs 102 may generate electrical signals that are proportional to an intensity of a received light signal. It should be noted that the use of photoreceptors and image recognition is provided merely by way of example and is not meant to be limiting. Other types of biological and electrical neural networks may be used to receive and process any type of input.

After receiving an input signal at the plurality of inputs 102, each of the plurality of inputs 102 may transmit pulses 106 to one or more neurons 104. The neural network 100 illustrates these pathways between the inputs 102 and the neurons 104 as a plurality of synapses 110. In a biological nervous system, a synapse is a structure that permits a neuron or nerve cell to pass an electrical or chemical signal to another neuron. In the neural network 100, biological synapses may be modeled using synapses 110 that pass a signal that is amplified/attenuated by synapse weights between the inputs 102 and the neurons 104 that represents the magnitude of the signal received by the inputs 102. The synapses 110 may also be weighted. For example, a single one of the plurality of inputs 102 may receive an input signal that is weighted differently by the synapses as it is sent to different neurons 104. The weighting of synapses 110 is what allows a neural network to "learn" to recognize specific input patterns and perform specific output tasks. When modeling the synapses 110 in a neural network, they may be represented by a semiconductor device that can receive a plurality of sequential input pulses and generate a corresponding output. For example, each input pulse may cause the synapse output to gradually increase between a logic 0 and a logic 1 level.

The synapses 110 may connect the inputs 102 to one or more neurons 104. These connections may be made in a one-to-many topology between the inputs 102 and the neurons 104. The neurons 104 in the neural network may be modeled after biological neurons, which are electrically excitable cells that communicate with other cells between connecting synapses. After receiving a sufficient number of input impulses, a neuron 104 may "fire" or transition into an excited state. The state may be associated with a sensory response (e.g., touch, sound, light, etc.) and/or motor controls from the brain. To approximate the behavior of a biological neuron, the neurons 102 in the neural network 100 may be implemented using any device that can receive a plurality of input pulses from one or more synapses 110, and after receiving a threshold number of input pulses, cause the outputs 108 of the neurons 104 to toggle between logic 0 and logic 1 states.

FIG. 1 illustrates a greatly simplified view of the neural network 100 in order to describe the various network components clearly. In practice, the neural network 100 may also include one or more hidden layer neurons and synapses between the inputs 102 and the outputs 108. These hidden or intermediate layers allow the task of generating the final outputs 108 to be broken down into sub-steps, each of which may be represented by a corresponding hidden layer of synapses and neurons. For example, the neural network 100 may be configured to distinguish between two different types of images, causing output 108a to fire when recognizing a first type of image, and causing output 108b to fire when recognizing a second type of image. A first hidden layer of neurons and synapses may recognize edges within the images. A second hidden layer of neurons and synapses may recognize shapes forwarded by the edges within the images. Finally, the neurons 104 in the output stage may combine the recognized shapes to distinguish between the first and second image types. Therefore, the neural network 100 may be far more complex in terms of electrical components and connections than may be readily apparent in FIG. 1. Because of the size, complexity, speed requirements, and/or routing difficulties that may accompany complex modern neural networks, there is a great need for circuit elements that can represent biological neurons and synapses in a way that can still allow for efficient layout and fabrication of many devices on a single technology node.

Figure 2:
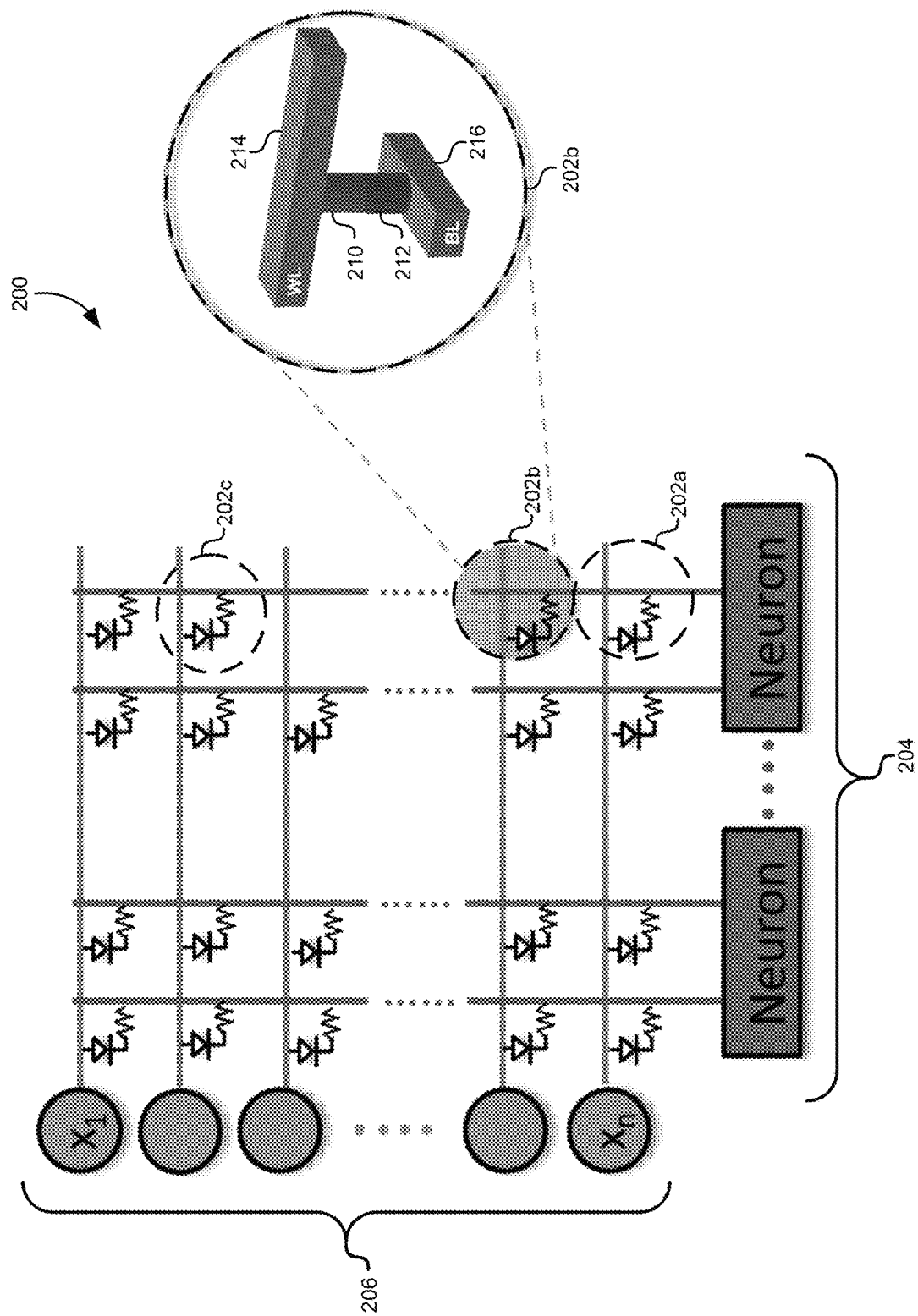
FIG. 2 illustrates a circuit network that implements a neural network, according to some embodiments.

FIG. 2 illustrates a circuit network 200 that implements a neural network, according to some embodiments. The neural network represented by the circuit network 200 may be similar to the neural network 100 in FIG. 1. As was the case for FIG. 1, FIG. 2 is a simplified view of a simple neural network where many connections and/or hidden layers may have been omitted for the sake of clearly describing the various circuit components that can be used to represent neurons and synapses. The circuit network 200 includes a plurality of inputs 206 that may correspond to the inputs 102 of FIG. 1. The inputs may be connected to a plurality of devices representing neurons 204 through devices representing synapses 202.

Many different devices may be used to represent synapses in the circuit network 200. In some embodiments, the synapses 202 may be implemented using semiconductor devices that can receive a plurality of input pulses and provide a proportional output to the neurons 204. Additionally, the neurons 204 may also be represented by discrete circuit devices. However, in contrast to the synapses 202 that gradually change their conductance with arriving excitation pulses, the neurons 204 may be configured to receive a plurality of pulses from the synapses 202 and fire after threshold number of pulses have been received. This basic network of circuit connections between the inputs 206 and the output neurons 204 may be augmented using hidden layers of transistors and/or other two-terminal resistive devices representing hidden layers of neurons and synapses as described above. When implementing the circuit network 200, it therefore may be beneficial to use semiconductor devices that can implement both the analog behavior of the synapses and the digital behavior of the neurons.

In s embodiments, many different types of devices may be used to implement the basic components of a neural network. For example, some embodiments may use a specific type of transistor known as a ferroelectric field-effect transistor (FeFET). A FeFET is a logic transistor that can maintain its logical state even when power is removed. FeFETs are similar to traditional metal oxide silicate (MOS) transistors, except that the logic gate dielectric is replaced with a ferroelectric material, which is a dielectric that "remembers," or stores electric fields to which it has been exposed. In a FeFET, a persistent dipole may be formed within the gate dielectric itself, thereby splitting the threshold voltage of the FeFET into two stable states that can represent binary logic states. Other embodiments may use ferroelectric FinFET devices.

In the embodiments described herein, the synapses may be represented by individual two-terminal memory elements. When using memory devices to model synapses, the circuit network 200 may be viewed as a form of non-volatile memory array. Each of the memory elements representing synapses 202 may be arranged in a rectangular grid pattern. Each of the memory elements may be configured to receive an applied voltage, and based on the polarity of the applied voltage, the memory elements representing the synapses 202 may change a physical state of a material in the memory element to represent a saved logic state, such as a logic 1 and a logic 0. When the voltage is no longer applied, the memory elements 202 may save the logic state induced by the applied voltage, and thus may operate as non-volatile memory elements.

In order to apply the voltage needed to read/write to the memory elements, signals may be received from the horizontal lines from the plurality of inputs 206. These horizontal lines may act as a word line in a traditional memory array. The bit lines may run in a perpendicular direction and connect to the output neurons 204. Therefore, applying a voltage between a single one input of the word lines and a single input of the bit lines may cause voltage to be applied across a single one of the memory elements representing synapses 202. This process can be used to select a single synapse 202 for a read and/or write operation.

FIG. 2 illustrates a detailed view of a single synapse 202b. This synapse 202b shows a word lines 214 and a bit lines 216 coupled to a selector device 210 and a memory device 212. To minimize the leakage current through the circuit network 200, and to isolate memory elements connected on the same word/bit lines, the synapse 202c may each include the selector device 210. The selector device 210 may be implemented between the memory device 212 and the word line 216. The selector device 210 may be used to reduce current from leaking through an individual memory element (i.e. synapse 202b) and the leakage and power dissipation of the whole array, as well as to prevent disturbances while a synapse is passively addressed to access a cell/synapse on the same bitline/wordline (unless a desired memory element/synapse is selected and sufficient voltage above the selector threshold is received by the synapse 202b). Therefore, when the voltage is applied to the word line 214 and the bit line 216, the synapse 202b is accessed while the selector devices in synapse 202a and synapse 202c may prevent their associated memory devices from being affected by the voltage on the shared bit line 216.

Many different technologies may be used to implement the memory device 212, such as phase-change memories (PCMs), oxide-resistive random-access memory (oxR-RAMs) or conductive-bridging memories (CBRAM) to name a few. The embodiments described herein may use a specific type of memory device known as a resistive random-access memory (ReRAM). A ReRAM is a type of non-volatile, random-access computer memory that operates by changing a resistance across a dielectric solid-state material. Generally, ReRAM devices generate oxygen ion/vacancy pairs in an oxide layer. These oxide ions/vacancies can subsequently conduct electrical current while oxygen ions can drift under an electric field. The motion of oxygen atoms through these vacancies in the oxide is similar to the motion of electrons and holes in a traditional semiconductor device. Applying a voltage to the ReRAM device generates these oxide vacancies to decrease the resistance of the device. When the voltage is removed, the oxide vacancies may remain in place and thereby store a nonvolatile state of the conductance level of the ReRAM device.

Some specific ReRAM devices may be referred to as filamentary ReRAM devices. Filamentary ReRAM devices may generate a conductive filament between opposing sides of the device. Filamentary ReRAM devices may be used to mimic the specific type of synaptic behavior in a neural network as described above. Specifically, filamentary ReRAM devices may exhibit an analog response to received input pulses. As more input pulses are received by the device, the conductive filament may gradually start to form in the oxide of the ReRAM device, and consequently the resistance of the device will gradually decrease. By gradually applying voltage pulses to the ReRAM device, the conductivity of the ReRAM device may be modulated in an analog fashion depending on the polarity, frequency, and duration of the applied voltage pulses. When used in this fashion, ReRAM devices may provide a very compact circuit footprint for mimicking synaptic behavior in the circuit network 200.

Figure 3B:
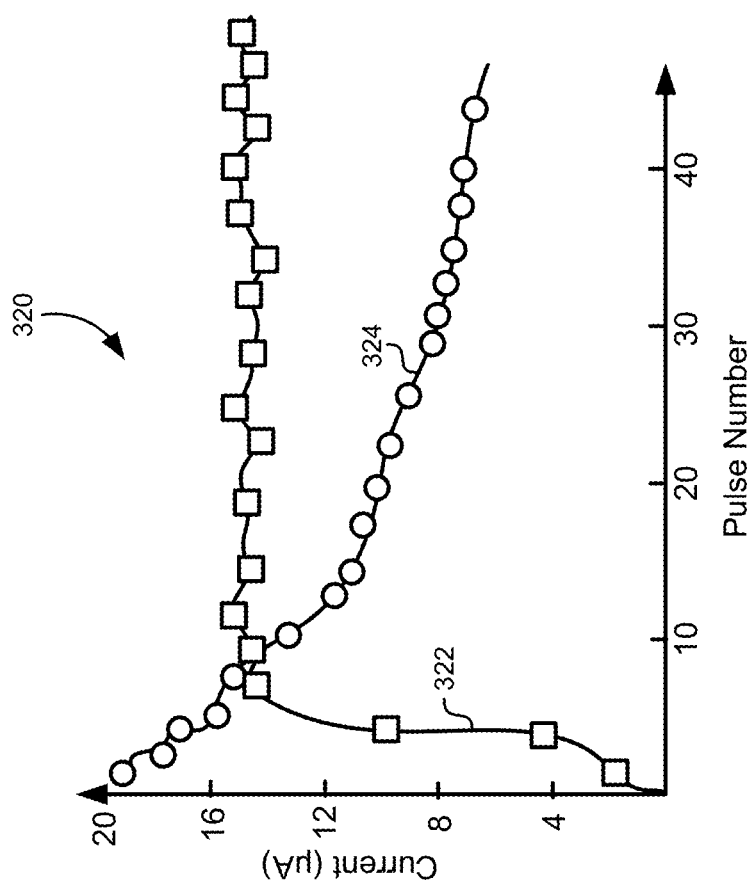
FIG. 3B illustrates a graph that shows the current through a traditional ReRAM device when receiving positive and negative pulses.
Figure 3A:
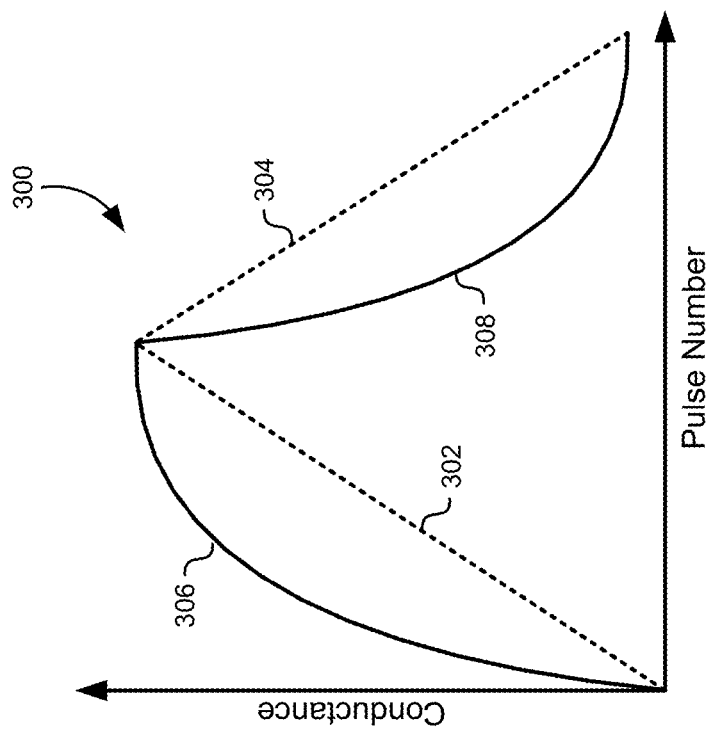
FIG. 3A illustrates a graph that shows the conductance of a traditional ReRAM device as discrete voltage pulses are received.

In contrast to binary memories that exhibit only two stable states (e.g., logic 0 and logic 1) analog memories, such as ReRAM devices, can tune their conductance to produce multiple stable states between the logic 0 and the logic 1 states. FIG. 3A illustrates a graph 300 that shows the conductance of a traditional ReRAM device as discrete voltage pulses are received. Ideally, the conductance of an analog memory should change linearly and symmetrically as voltages are applied to the device (represented by the dashed line). For example, applying positive pulses should increase the conductance, while applying negative voltages should decrease the conductance by the same amount. Curve 302 illustrates the ideal, linear response when receiving positive pulses, and curve 304 illustrates the ideal, linear response when receiving negative pulses.

However, formation of the conductive filament in a traditional ReRAM device is quite non-linear and exhibits very abrupt changes in conductivity as the filament quickly forms and dissipates during initial transitions between states. Curve 306 illustrates the actual, nonlinear response of a ReRAM device when positive pulses are received, and curve 308 illustrates the actual, nonlinear response of the ReRAM device when negative pulses are received. This nonlinear, abrupt behavior makes it difficult to use ReRAMs to model analog synaptic behavior where gradual and linear transitions should be observed. It also decreases the precision and efficiency of the neural learning within the array.

In addition to requiring an approximately linear response, synaptic behavior also exhibits an approximately symmetric response when positive and negative pulses are received. FIG. 3B illustrates a graph 320 that shows the current through a traditional ReRAM device when receiving positive and negative pulses. Curve 322 represents the ReRAM current when positive pulses are received. As shown by curve 322, the current begins to conduct very quickly in the ReRAM soon after initial positive pulses are received. After these initial pulses are received, the response shown by curve 322 becomes much more linear and gradual. Curve 324 represents the ReRAM response when negative pulses are received. In contrast to curve 322, curve 324 shows that the response to negative pulses—although not linear—is far more gradual than the response to positive pulses. Therefore, depending on a current conductive state of the ReRAM device, the change in output current may not be the same when a single positive pulse is received in comparison to a single negative pulse received. This asymmetric behavior means that positive and negative pulses will be treated differently when attempting to model a synapse. Pulse tailoring is very difficult, as it requires complex peripheral circuitry for the voltage generation, which reduces the effective area of the synaptic array. Therefore, this problem is treated from a kinetic perspective of the potentiation and depression process.

These problems of (1) asymmetric potentiation and depression and (2) nonlinear responses may make the ReRAM unsuitable when attempting to model ideal synaptic behavior. The embodiments described herein present methods and devices for designing ReRAM devices such that the output response becomes more linear and more symmetric. These embodiments address the root cause of the asymmetric problem and the nonlinear problem, namely the positive feedback created by heat generation as a conductive filament begins to form in the ReRAM device.

Figure 4:
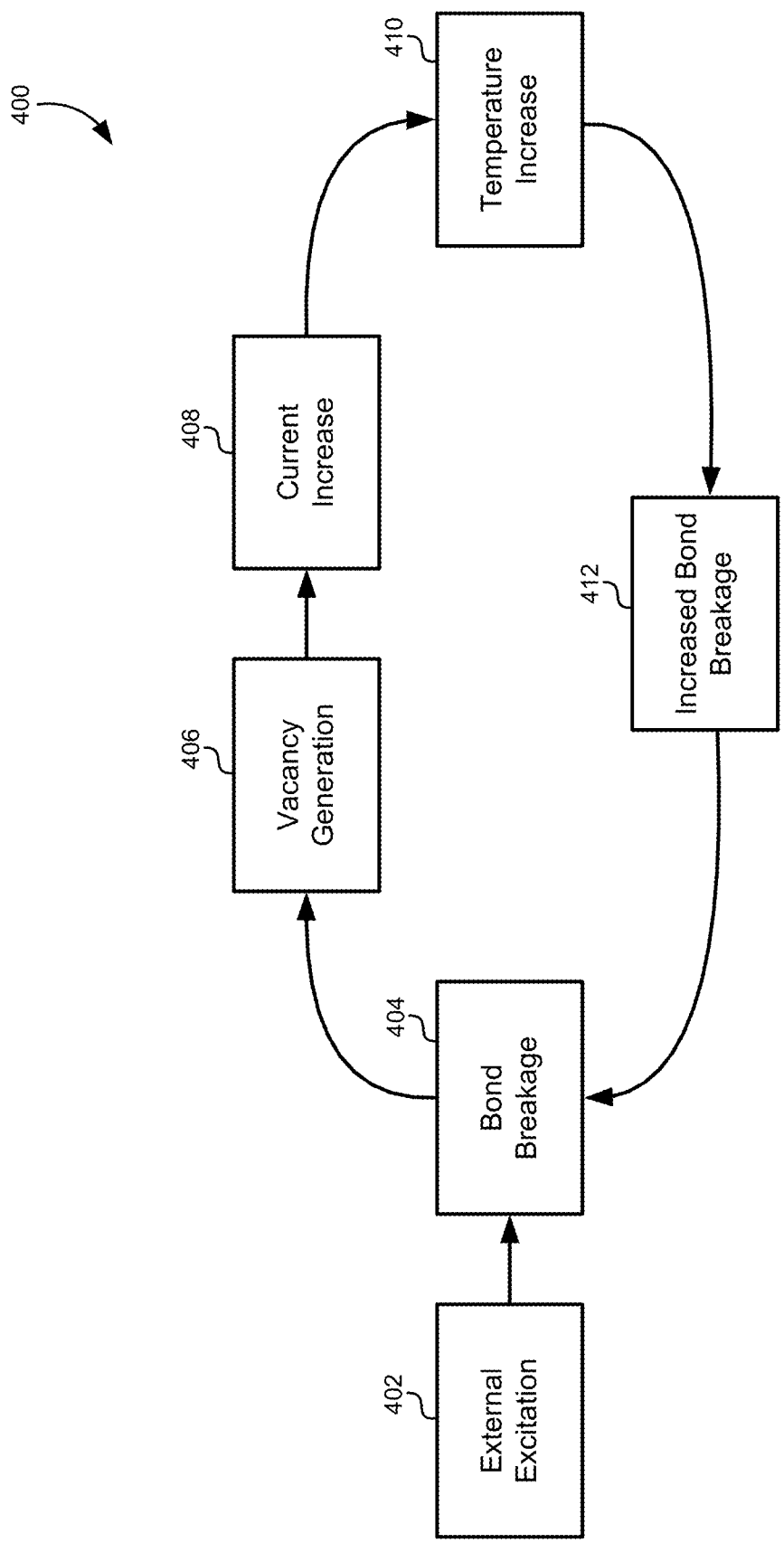
FIG. 4 illustrates a positive feedback cycle that has been discovered in a ReRAM device as positive voltage pulses are received.

FIG. 4 illustrates a positive feedback cycle that has been discovered in a ReRAM device as positive voltage pulses are received. The positive voltage pulses represent a form of external excitation (402) that adds energy to the oxide of the ReRAM device. This added energy causes bond breakage in the oxide structure (404), which frees oxygen atoms and creates oxide vacancies (406). These oxide vacancies begin to form a conductive filament in the ReRAM device, and by so doing cause an increase in the conductivity and current that may flow through the ReRAM device (408). As current flow increases in the ReRAM device, the temperature surrounding the conductive filament begins to increase (410) this additional energy surrounding the conductive filament increases the rate at which bonds break (412). Therefore, forming the conductive filament generates heat which in turn speeds up the formation of the conductive filament, creating a positive feedback cycle that produces the non-linear responses described above. The difference between heat generation when current increases and the lack of heat generation when the current decreases produces the asymmetric responses when observing positive and negative voltage pulses described above. Essentially, the asymmetry is due to the different kinetics of the positive and negative processes.

Thermal Engineered Layer

To solve the problems of asymmetry and nonlinearity, the embodiments described herein may be designed to remove heat from portions of the ReRAM device when the conductive filament is forming. Special layers may be added to the ReRAM device that are specifically designed to act as heatsinks to pull heat out of the active layer between the electrodes during filament formation. These layers may be thermally engineered to have a relatively high thermal conductivity compared to the thermal conductivity of the active layer and the electrodes. These layers may be referred to herein as Thermally Engineered Layers (TEL).

Figure 5:
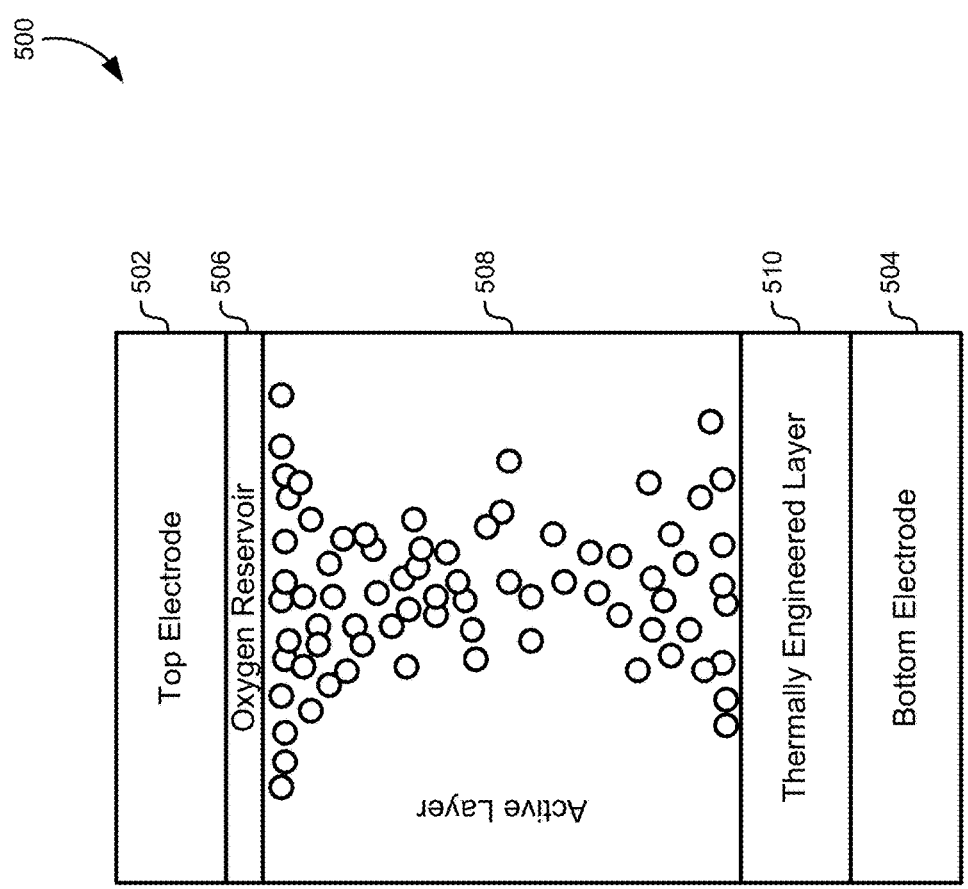
FIG. 5 illustrates a ReRAM device with a thermally engineered layer adjacent to a bottom electrode, according to some embodiments.

FIG. 5 illustrates a ReRAM device 500 with a thermally engineered layer 510 adjacent to a bottom electrode 504, according to some embodiments. The ReRAM device 500 includes both a top electrode 502 and a bottom electrode 504. An active layer 508 comprising an oxide material may be disposed between the top electrode 502 and the bottom electrode 504. The active layer 508 is where the defects form in the oxide when voltages are applied between the top electrode 502 and the bottom electrode 504. These defects may begin to form a conductive filament as described above. The conductive filament changes the resistance of the ReRAM device 500, and the filament persists even after voltages are removed. Therefore, the resistance of the ReRAM device 500 can store an analog resistance between a nominal high resistance (e.g., no filament formed) and a nominal low resistance (e.g., filament completely formed). Because the state is saved, the ReRAM device 500 can act as an analog memory device between voltage applications.

As used herein, the terms "top" and "bottom" when referring to the top electrode 502 and the bottom electrode 504 may describe relative positions in a fabrication process. In one sense, the term "bottom" may refer to an electrode that is deposited first in a manufacturing process, while the term "top" may refer to an electrode that is deposited after the bottom electrode in a manufacturing process. Alternatively, the top electrode 502 may be designated by the direction of a positive voltage across the ReRAM device 500, while the bottom electrode 604 may be designated by the direction of a negative voltage across the ReRAM device 500. However, these terms are not meant to imply any other type of ordering, precedence, or importance when comparing the two electrodes 502, 504. These electrodes 502, 504 may also be referred to as a "first" electrode and/or a "second" electrode. Again, the terms first/second do not necessarily imply any form of order, importance, or precedence for the two electrodes, but are merely used to distinguish one electrode from the other. In some cases, the top electrode may be referred to as a first electrode and the bottom electrode may be referred to as a second electrode.

An oxygen reservoir 506 may form near the top electrode 502 as the filament begins to form. The oxygen reservoir 506 is not a specific physical region that is designed into the ReRAM device 500. Instead, the oxygen reservoir 506 may be a portion of the active layer 508 near the top electrode 502 where oxygen atoms congregate after being released from the oxide. As voltages are applied to the ReRAM device 500 and the filament begins to form. Oxygen atoms may be removed from the oxide, creating vacancies/defects that begin to form the conductive filament. In FIG. 5, these vacancies are represented as the small circles in the active layer 508 shown as they begin to form a filament between the top electrode 502 and the bottom electrode 504. The oxygen atoms that are removed from the active layer 508 tend to congregate around one of the two electrodes 502, 504 as a result of this process.

Prior to this disclosure, ReRAM devices were fabricated without any intervening layers between the top electrode 502, the active layer 508, and the bottom electrode 504. The thermal conductivity of common materials used for the top electrode 502 and the bottom electrode 504 were in the range of approximately 0.001 W/cmK. This is a relatively low thermal conductivity, and thus the top electrode 502 and the bottom electrode 504 inadvertently acted as thermal insulators, trapping heat generated by the filament formation process in the active layer 508. Because this heat was trapped in the active layer 508, it contributed to the formation of more vacancies in the oxide, and produced the positive thermal feedback loop described above in relation to FIG. 4. As the oxygen reservoir 506 was formed, it also had a thermal conductivity in the range of approximately 0.001 W/cmK. Thus, the oxygen reservoir 506 also contributed to the thermal insulation of the ReRAM device 500.

The thermal conductivity of common materials previously used for the top electrode 502 and the bottom electrode 504 were in the range of approximately 0.4 W/cmK-0.8 W/cmK. Even though this was regarded as mid-to-high thermal conductivity, the parasitic formation of the oxygen reservoir 506 in the vicinity of the top electrode is characterized with rather low thermal conductivity, and this inadvertently acted as a thermal insulator, trapping heat generated by the filament formation process in the active layer 508. Because this heat was trapped in the active layer 508, it contributed to the formation of more vacancies in the oxide, and produced the positive thermal feedback loop described above in relation to FIG. 4.

In some embodiments, a thermally engineered layer 510 may be added between the bottom electrode 504 and the active layer 508. The thermally engineered layer 510 may have a relatively high thermal conductivity. Any of the thermally engineered layers described herein may include any material having a thermal conductivity higher than approximately 0.5 W/cmK. Specific embodiments may use thermally engineered layers having a thermal conductivity higher than approximately 0.1 W/cmK, 0.2 W/cmK, 0.3 W/cmK, 0.4 W/cmK, 0.5 W/cmK, 0.6 W/cmK, 0.7 W/cmK, 0.8 W/cmK, 0.9 W/cmK, and/or 1.0 W/cmK. Some embodiments may use thermally engineered layers having thermal conductivities in the range of approximately 0.3 W/cmK to approximately 1.5 W/cmK. Some embodiments may use thermally engineered layers with thermal conductivities that are defined in relation to the thermal conductivities of other materials used in the ReRAM device 500. For example, some embodiments may use thermally engineered layers having a thermal conductivity that is 10 times, 20 times, 50 times, 80 times, 100 times and/or 150 times greater than the thermal conductivity of, for example, the bottom electrode 504, the top electrode 502, and/or the oxygen reservoir 506. These ranges of values may apply to any thermally engineered layer illustrated or described in this disclosure. In this embodiment, the thermally engineered layer 510 may be positioned between the bottom electrode 504 (or a "first" electrode) and the active layer 508.

In this case, the thermally engineered layer 510 may act as a heat sink to pull heat energy out of the active layer 508 as the conductive filament is being formed in response to an applied voltage. Therefore, when voltages are applied, the thermally engineered layer 510 may reduce and regulate the temperature of the active layer 508. Instead of heat generated by the filament-formation process being trapped in the active layer 508 and contributing to a positive thermal feedback cycle, this heat is removed from the device through the thermally engineered layer 510. This in turn reduces the abruptness of defect creation and hence nonlinearity of the conductance curve illustrated in FIG. 3A, making the response more ideal. Additionally, because the heat in the active layer 508 is regulated by the thermally engineered layer 510, the heat in the active layer 508 for positive and negative voltages becomes more congruent. This produces a more symmetric response instead of the asymmetric response illustrated in FIG. 3B. Essentially, the thermally engineered layer 510 can regulate and control the speed of defects/vacancies generation in the oxide and prevent the abrupt breakdown behavior that plagued ReRAM devices prior to this disclosure.

Some embodiments may be designed to engineer specific temperature profiles within the ReRAM device 500. For example, through simulation or actual physical measurement, a temperature profile may be derived for the active layer 508 when voltages are applied. This temperature profile may then be used to identify regions of the active layer 508 that become disproportionately hot as oxygen atoms are freed. Specific regions of the active layer 508 can be identified that generate and/or hold a disproportionate amount of thermal energy throughout each stage of the process. This temperature profile can then be used to place thermally engineered layers at specific locations in the ReRAM device 500 to regulate the temperature profile. For example, these thermally engineered layers can be located such that the temperature profile is both consistent throughout the active layer 508 and throughout the filament formation process over time. For example, some embodiments may place thermally engineered layers such that a temperature deviation in the active layer 508 is less than approximately 20° K, 30° K, 40° K, 50° K, 60° K, 70° K, 80° K, 100° K, and/or any other temperature deviation in the range of approximately 10° K to approximately 150° K. These thermally engineered layers can also be located such that the regulated, uniform temperature of the active layer 508 stays below a threshold temperature. For example, thermally engineered layers may be placed based on a measured/simulated temperature profile such that a maximum temperature in the active layer 508 stays below 300° K, 320° K, 330° K, 340° K, 350° K, 360° K, 370° K, and/or any other temperature in the range of approximately 275° K to approximately 400° K.

The thickness of the thermally engineered layer 510 may be sized according to predetermined ranges, or based on the size of the ReRAM device and its internal components. In some embodiments, the thermally engineered layer 510 may be between approximately 1 nm and approximately 4 nm in width (i.e., from top to bottom). Some embodiments may use a thermally engineered layer 510 that is 1 nm, 2 nm, 3 nm, 4 nm, 5 nm, and so forth. Some embodiments may use a thermally engineered layer 510 that is between approximately 5% and approximately 30% of a width of the active layer 508. Some embodiments may use a thermally engineered layer 510 that is between approximate 50% and approximately 150% of a width of the bottom electrode 504 or the top electrode 502. In some embodiments, a specially alloyed electrode can play a role of thermally engineered layer as well.

The design and placement of thermally engineered layers may be performed through iterative simulations to tune their placement and/or thermal conductivity values to produce the desired stability and response in the active layer 508. For example, various simulations may be performed using software known in the art to place thermally engineered layers at different locations in the ReRAM device 500. The results of the simulations may be analyzed to identify optimal locations for the thermally engineered layers. Based on different materials used in the ReRAM device 500, along with the different fabrication processes and operating environments of the ReRAM device 500, many different placement geometries for thermally engineered layers are possible. The following figures illustrate a number of different locations and geometries for different thermally engineered layers that may be used in various embodiments. However, these figures are not meant to be limiting, and should be considered examples of different locations/geometries that may be used based on the needs of the specific device and/or application. Some embodiments may size the thermally engineered layer 510 based on the simulated results. For example, the thickness of the thermally engineered layer 510 may start at 1 nm, and may be increased until simulated results show a temperature profile that falls within a predetermined acceptable range.

The process described above may be used to place thermally engineered layers in many different locations. However, it would be impossible to describe every possible configuration of thermally engineered layers in a ReRAM device. Therefore, by identifying hotspots in the active layer 508, placing thermally engineered layers near the hotspots, and testing/simulating the response to verify that the hotspots have been regulated, many different placements and geometries for thermally engineered layers not specifically disclosed herein will fall within the scope of this disclosure.

Figure 6:
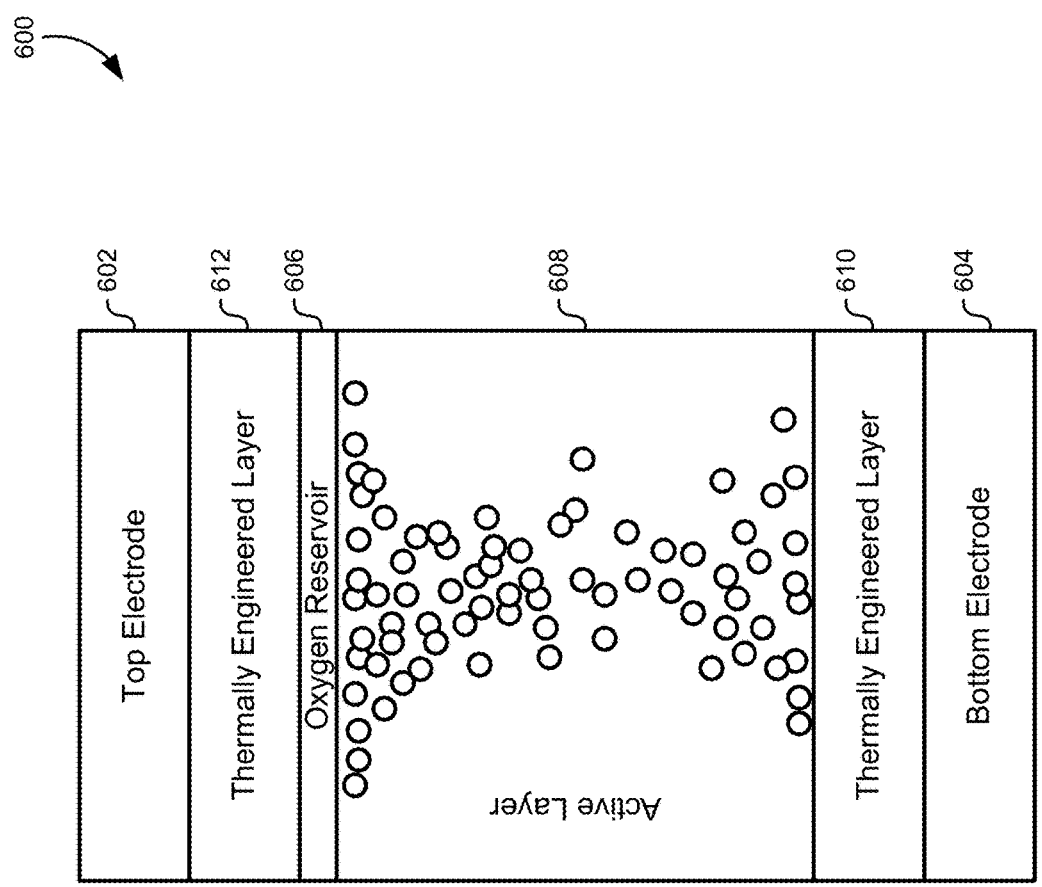
FIG. 6 illustrates a ReRAM device with thermally engineered layers near both electrodes, according to some embodiments.

FIG. 6 illustrates a ReRAM device 600 with thermally engineered layers near both electrodes, according to some embodiments. This embodiment is similar to that of FIG. 5, except that an additional thermally engineered layer has been added to the design. Similar to FIG. 5, a thermally engineered layer 610 may be placed between a bottom electrode 604 and an active layer 608. Additionally, a second thermally engineered layer 612 may be placed between the top electrode 602 and the active layer 608. This additional thermally engineered layer 612 allows heat to be pulled from the active layer 608 through both the top of the active layer 608 near the top electrode 602 as well as through the bottom of the active layer 608 near the bottom electrode 604.

The oxygen reservoir 606 may have a thermal conductivity on the order of approximately 0.001 W/cmK. This may be similar to the thermal conductivity of the top electrode 602 and/or the bottom electrode 604. Therefore, as the oxygen reservoir 606 forms, it may provide a minor thermal insulating effect across one side of the active layer 608. Some embodiments not explicitly shown in FIG. 6 may use only a single one of the thermally engineered layers 610, 612 placed on either the top or the bottom of the active layer 608. Yet it is anticipated that the introduction of a thermally engineered layer between the top electrode and active region may reduce the thickness of this layer and its thermal-isolating properties. In some embodiments, a thermally engineered layer 612 may be placed such that it will be adjacent to a location where the oxygen reservoir 606 is expected to form. For example, some embodiments may include the thermally engineered layer 612 next to the top electrode 602 without including the thermally engineered layer 610 next to the bottom electrode 604.

When determining whether to place thermally engineered layers 610, 612 next to the top electrode 602, the bottom electrode 604, or both electrodes 602, 604, A circuit designer may use the simulated and/or tested temperature profile to make this determination. For example, if a temperature profile reveals a hot thermal region near the oxygen reservoir 606 in response to positive voltages, the thermally engineered layer 612 may be placed next to the top electrode 602 without requiring the thermally engineered layer 610 to be placed near the bottom electrode 604, and vice versa. In another example, if a temperature profile reveals a hot thermal region near the center of the active layer 608, then the thermally engineered layers 610, 612 may be placed in both locations to draw heat from the active layer 608 equally through both the top and bottom of the active layer 608.

Figure 7:
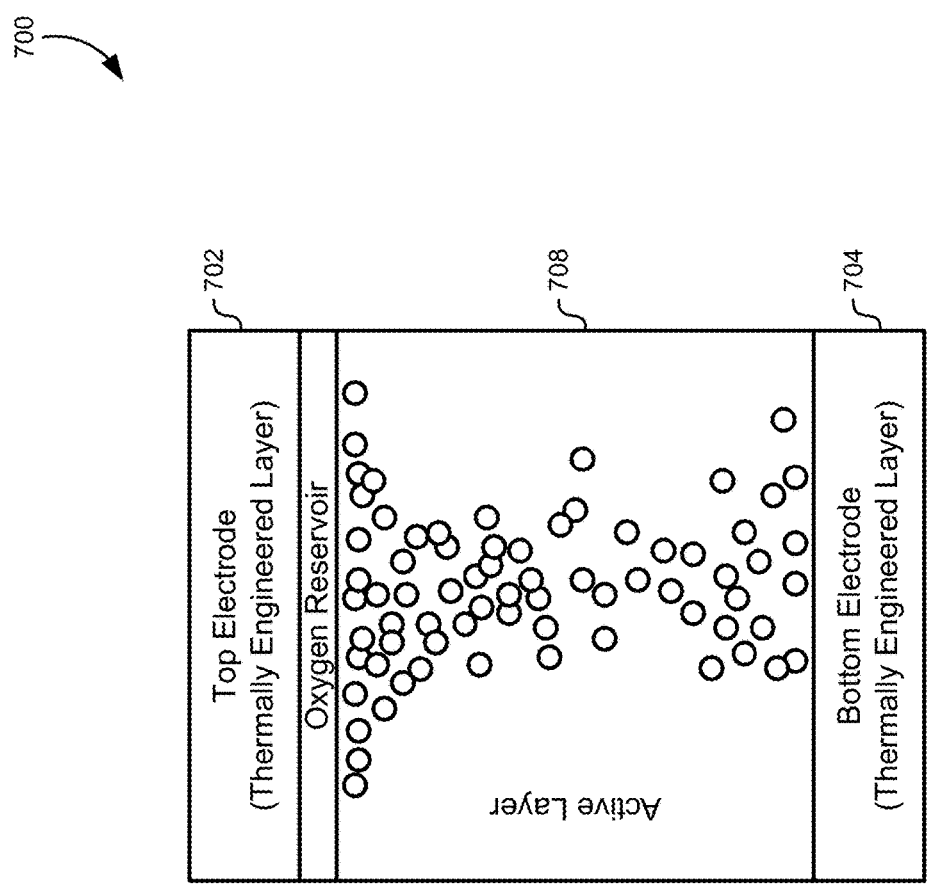
FIG. 7 illustrates a ReRAM device where the electrode materials themselves can act as thermally engineered layers, according to some embodiments.

FIG. 7 illustrates a ReRAM device 700 where the electrode materials themselves can act as thermally engineered layers, according to some embodiments. Instead of adding a separate thermally engineered layer to the ReRAM device 700 between a top electrode 702 and an active layer 708, or between a bottom electrode 704 and the active layer 708, materials may be chosen for the top electrode 702 and/or the bottom electrode 704 such that they act as thermally engineered layers themselves. Specifically, an electrically and thermally conductive material may be selected for one or both of the electrodes 702, 704 such that they can act both as electrical conductors for normal operation of the ReRAM device 700, as well as thermal conductors to regulate temperature in the active layer 708. The thermal conductance of the electrodes 702, 704 may fall within any of the thermal conductance ranges or have any of the thermal conductance values described above.

By using thermally conductive materials for the top electrode 702 and/or the bottom electrode 704, the fabrication process for the ReRAM device 700 may be simplified. Specifically, fabricating the ReRAM device 700 without separate thermally engineered layers may require fewer steps in the fabrication process. By using thermally and electrically conductive material for the top electrode 702 and/or the bottom electrode 704, the ReRAM device 700 may be fabricated using the same number of steps as was previously required to fabricate traditional ReRAM devices.

For any embodiment, any combination of the various options for thermally engineered layers described in this disclosure may be combined in any combination and without limitation. For example, some embodiments may include a thermally engineered bottom electrode, a thermally engineered layer between the bottom electrode and the active layer, a thermally engineered layer between the active layer and the top electrode, and/or a thermally engineered top electrode, in any combination.

Figure 8:
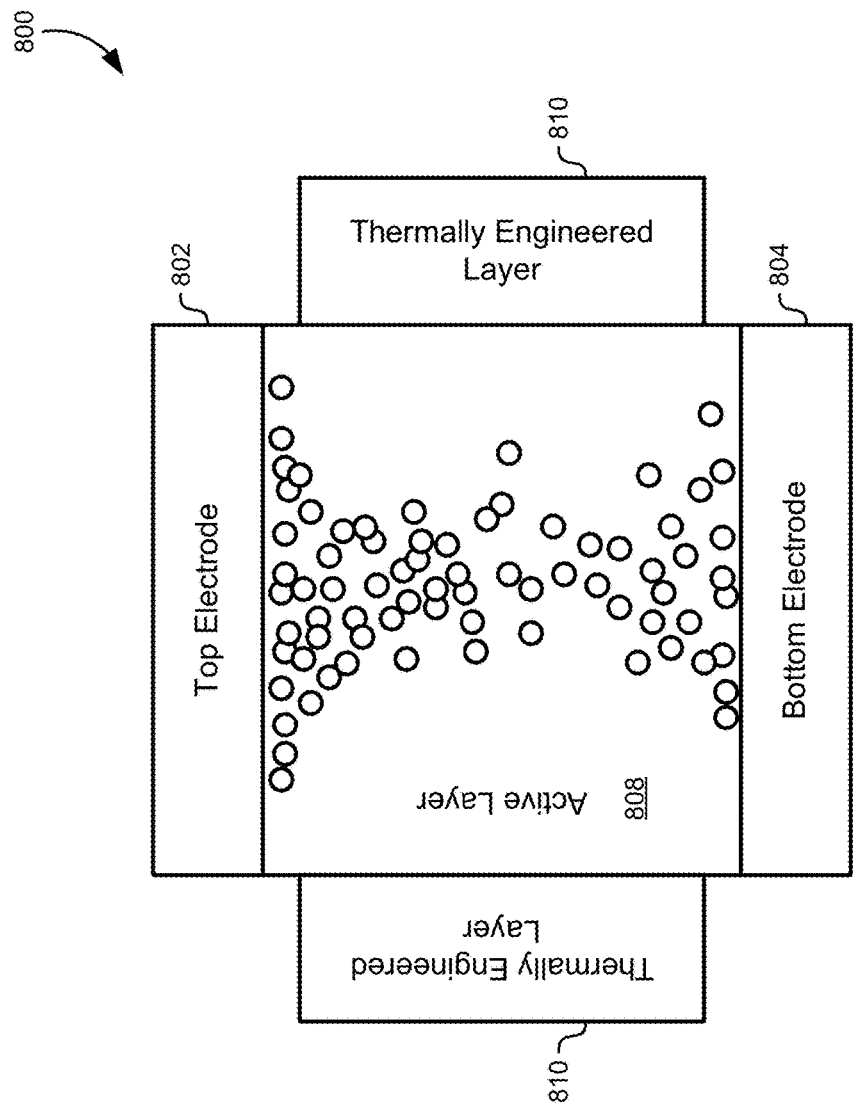
FIG. 8 illustrates a ReRAM device with a thermally engineered layer wrapped around the active layer, according to some embodiments.

FIG. 8 illustrates a ReRAM device 800 with a thermally engineered layer 810 wrapped around the active layer 808, according to some embodiments. Instead of inserting a thermally engineered layer between a top electrode 802 and an active layer 808 or between a bottom electrode 804 and the active layer 808, some embodiments may instead wrap a thermally engineered layer 810 around the active layer 808. Note that the oxygen reservoir has been omitted from this figure and the following figures for clarity. FIG. 8 may be considered a vertical cross-section of the ReRAM device 800. Therefore, although the thermally engineered layer 808 is depicted on both sides of the active layer, it will be understood that the thermally engineered layer 810 wraps around the active layer 808 when viewed in three dimensions. The active layer 808 may have any geometry (e.g., cylindrical, cubicle, etc.). Regardless of the geometry of the active layer 808, the thermally engineered layer 810 can enclose and/or surround the sides of the active layer 808 completely or partially. During a manufacturing process, the thermally engineered layer 810 can be deposited first, and the active layer 808 can be deposited inside the thermally engineered layer 810. Therefore, any irregularities in the geometry of the active layer 808 may conform to the geometry of the surrounding thermally engineered layer 810. This ensures that the thermally engineered layer 810 can be closely thermally coupled to the active layer 808. Note that some embodiments do not require this close thermal coupling, and instead may optionally include other materials between the thermally engineered layer 810 and the active layer 808. It should be noted that this layer may be an electrical isolator in order to prevent a short between the top and bottom electrode. In a general sense, the active layer 808 may include a first side that is adjacent to a first electrode 840, and a second side that is orthogonal to the first side and adjacent to the thermally engineered layer 810.

This configuration for the thermally engineered layer 810 may be configured to draw heat out of the active layer 808 through the sides of the active layer 808. Instead of drawing heat out of the top and/or the bottom of the active layer 808, this embodiment can draw heat out of the active layer 808 along its entire vertical width. This configuration may be useful when a temperature profile shows that the active layer tends to heat up in a middle region of the active layer as opposed to a top or bottom area of the active layer.

The thermally engineered layer 810 may have a width that is greater than, equal to, or less than a width of the active layer 808. In some embodiments, the thermally engineered layer 810 may be wider than the active layer 808, such that it extends past the active layer to make contact with a side of the bottom electrode 804. In these configurations, the thermally engineered layer 810 may use a thermally conductive material that is also an electrical insulator. This may be beneficial to avoid shorting the top electrode 802 to the bottom electrode 804. In some embodiments, the thermally engineered layer 810 may be the same width of the active layer 808. Although not shown explicitly in FIG. 8, the bottom electrode 804 may extend farther out to the left/right of the illustration to extend underneath the thermally engineered layer 810 as well as the active layer 808. In these configurations, the bottom electrode 804 may be deposited first, and the thermally engineered layer 810 and/or the active layer 808 may be deposited on top of the bottom electrode 804. In some embodiments, the thermally engineered layer 810 may have a smaller width then the active layer 808. Although not depicted explicitly in FIG. 8, these configurations may leave a portion of the side of the active layer 808 that is not covered by the thermally engineered layer 810, thereby leaving a gap between the thermally engineered layer 810 and the bottom electrode 804 and/or top electrode 802. This allows a thermally conductive and electrically conductive material to be used for the thermally engineered layer 810, as this gap prevents the top electrode 802 from shorting with the bottom electrode 804 through the thermally engineered layer 810. Some embodiments may leave a gap between the bottom electrode 804 and the thermally engineered layer 810, while not leaving such a gap between the top electrode 802 and the thermally engineered layer 810, or vice versa. This configuration also permits the thermally engineered layer 810 to be fabricated using electrically conductive material. Some embodiments may leave a gap between the bottom electrode 804 and the thermally engineered layer 810 as well as a gap between the top electrode 802 and the thermally engineered layer 810.

A thickness of the thermally engineered layer may be determined based on the particular design. The thickness (i.e., horizontal dimension) of the thermally engineered layer 810 may have an outer circumference that is between approximately 1 nm and approximately 20 nm greater than its inner circumference. Some embodiments may have a thickness that is greater than 20 nm. Some embodiments may have a thickness based on the thickness of the active layer 808. For example, the thickness of the thermally engineered layer 810 may be between approximately 5% and approximately 50% of the thickness of the active layer 808.

Figure 9:
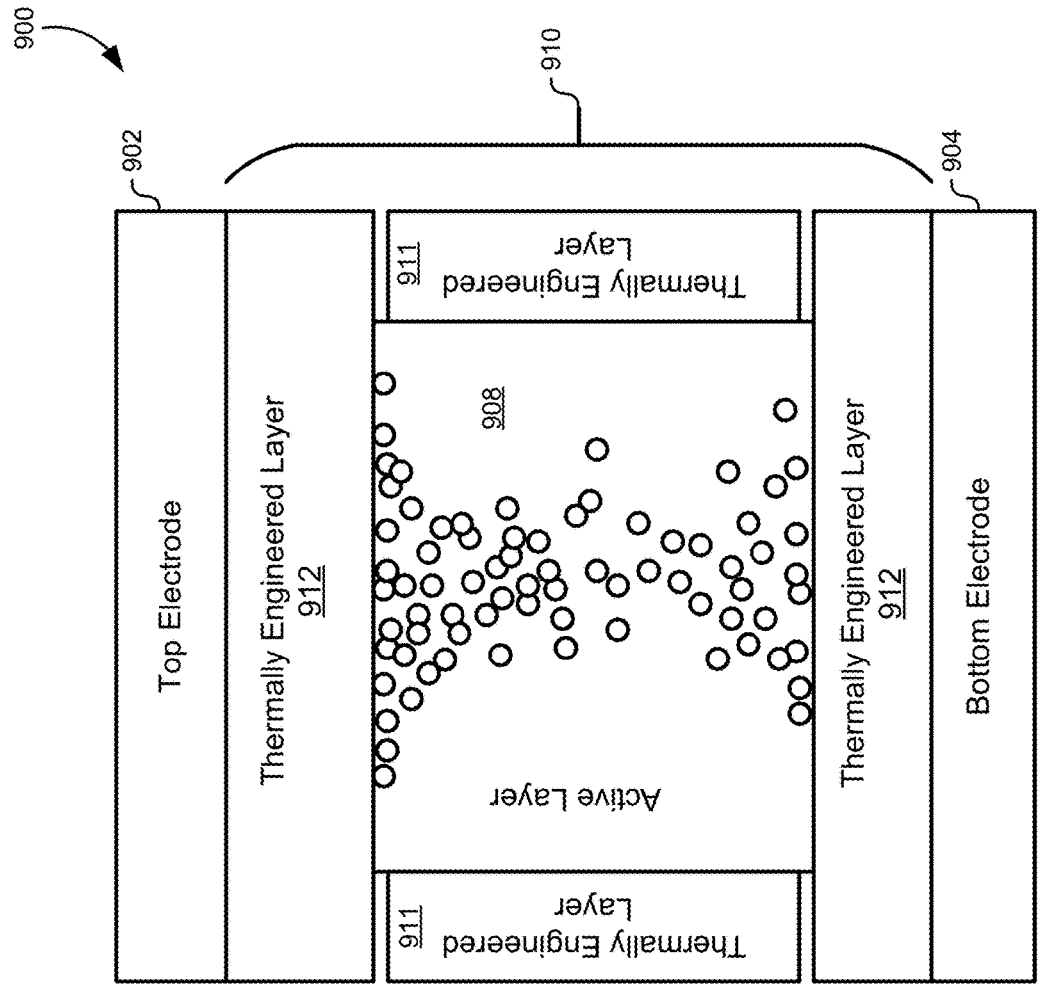
FIG. 9 illustrates a ReRAM device for a thermally engineered layer that is wrapped around an active layer in multiple dimensions, according to some embodiments.

FIG. 9 illustrates a ReRAM device 900 for a thermally engineered layer 910 that is wrapped around an active layer 908 in multiple dimensions, according to some embodiments. Instead of only wrapping a thermally engineered layer 910 around an active layer 908 on the sides of the active layer 908, these embodiments can instead enclose the active layer 908 inside of the thermally engineered layer 910, which may be separated into vertical sections 911 that are non-conductive, and horizontal section that are conductive. For example, the thermally engineered layer 910 can be deposited on a bottom, top, and sides of the active layer 908. This may have the effect of drawing heat out of the active layer 908 from multiple directions.

The thickness of the thermally engineered layer 908 may be sized in relation to the active layer 908, the top electrode 902, and/or the bottom electrode 904 as described above. For example, the width of the sides of the thermally engineered layer 910 may be sized based on the above-stated ranges and/or a dimension of the active layer 908 to fit the thermal profiles of the device. The top and bottom portions of the thermally engineered layer 910 may be sized based on the above-stated ranges and/or based on a dimension of the active layer 908 and/or a dimension of one of the electrodes 902, 904.

Although FIG. 9 illustrates the thermally engineered layer 910 almost completely enclosing the active layer 908, while leaving small portions of the active layer exposed for electrical isolation. For example, some embodiments may enclose the sides and top of the active layer 908 with the thermally engineered layer 910, while leaving a bottom portion of the active layer 910 exposed for contact with the bottom electrode 904. Alternatively, some embodiments may enclose the sides and bottom of the active layer 908 with the thermally engineered layer 910, while leaving a top portion of the active layer 910 exposed for direct contact with the top electrode 902. Other embodiments may leave portions of the sides exposed while wrapping the thermally engineered layer 910 around the top and bottom of the active layer 908 to leave a center width of the active layer 908 exposed. Any of these different configurations may be used in any combination and without limitation.

The thermally engineered layer 910 of FIG. 9 may be used in any combination with the thermally engineered layers depicted in other figures and/or described in other embodiments of this disclosure. For example, the top electrode 902 and/or the bottom electrode 904 may be replaced with thermally engineered material as described in relation to FIG. 7. In these configurations, the top electrode 902 and/or the bottom electrode 904 may replace a top and/or bottom portion of the thermally engineered layer 910. In any configuration, the thermally engineered layer 910 may use a thermally conductive and electrically insulating material to avoid shorting the top electrode 902 with the bottom electrode 904 when appropriate. Some embodiments may also leave gaps between portions of the thermally engineered layer 910 such that electrically conductive material can be used for the thermally engineered layer 910 without shorting the top electrode 902 to the bottom electrode 904. For example, some embodiments may leave a gap in a center portion of the thermally engineered layer 910 to create an electrical discontinuity between the top electrode 902 and the bottom electrode 904.

Figure 10:
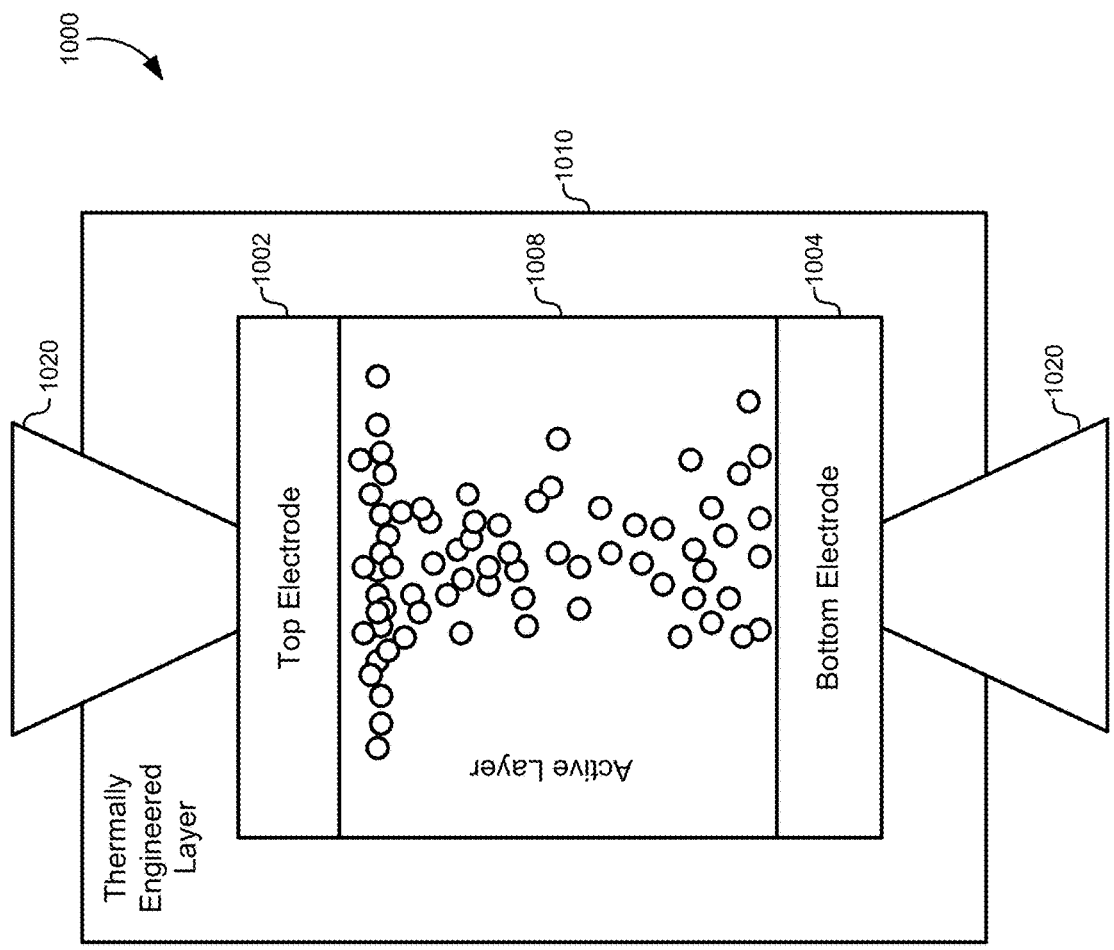
FIG. 10 illustrates a ReRAM device that is enclosed within a thermally engineered layer, according to some embodiments.

FIG. 10 illustrates a ReRAM device 1000 that is enclosed within a thermally engineered layer 1010, according to some embodiments. In contrast to some embodiments discussed above, some embodiments may encase all or most of the ReRAM device 1000 inside of the thermally engineered layer 1010. The thermally engineered layer 1010 may be nonconductive to avoid shorting the top electrode 1002 with the bottom electrode 1004. The fabrication process for the ReRAM device 1000 may be carried out as usual to deposit a bottom electrode 1004, an active layer 1008, and a top electrode 1002. However, before depositing the bottom electrode 1004, a bottom portion of the thermally engineered layer 1010 may be deposited. Some embodiments may also deposit the sides of the thermally engineered layer 1010 and remove the cavity into which the bottom electrode 1004, the active layer 1008, and the top electrode 1002 may be deposited. After the ReRAM device 1000 has been fabricated, the top portion of the thermally engineered layer 1010 may be deposited. Some embodiments may include conductive vias or plugs 1020 to provide adequate contact with the top electrode 1002 and/or the bottom electrode 1004.

Some embodiments may entirely encase the ReRAM device 1000 inside the thermally engineered layer 1010 as depicted in FIG. 10. However, some embodiments may leave portions of the ReRAM device 1000 exposed. For example, a gap may be created around the center of the thermally engineered layer 1010 such that a top portion of the thermally engineered layer 1010 is electrically isolated from a bottom portion of the thermally engineered layer 1010. This may prevent the top electrode 1002 from being shorted to the bottom electrode 1004 as described above. The gap may be filled with material having a relatively low level of electrical conductivity. The thickness of the thermally engineered layer 1010 may be sized according to the process described above, for example, in relation to FIG. 9. In any of these configurations, a VIA or other electrical connection may extend out of the top electrode 1002 and/or the bottom electrode 1004 to connect the ReRAM device 1000 to other devices in a circuit network.

The thermally engineered layer 1010 may be combined or augmented with any of the other thermally engineered layers discussed herein. For example, the top portion of the thermally engineered layer 1010 may be substituted with a top electrode 1002 fabricated using a thermally conductive material such that the alloyed top electrode 1002 also forms the top portion of the thermally engineered layer 1010. The same may also be true of the bottom electrode 1004. When any portion of the thermally engineered layer 1010 contacts both the top electrode 1002 and the bottom electrode 1004, that portion of the thermally engineered layer 1010 may be fabricated using a material that is electrically nonconductive to avoid shorting the top electrode 1002 to the bottom electrode 1004.

Figure 11:
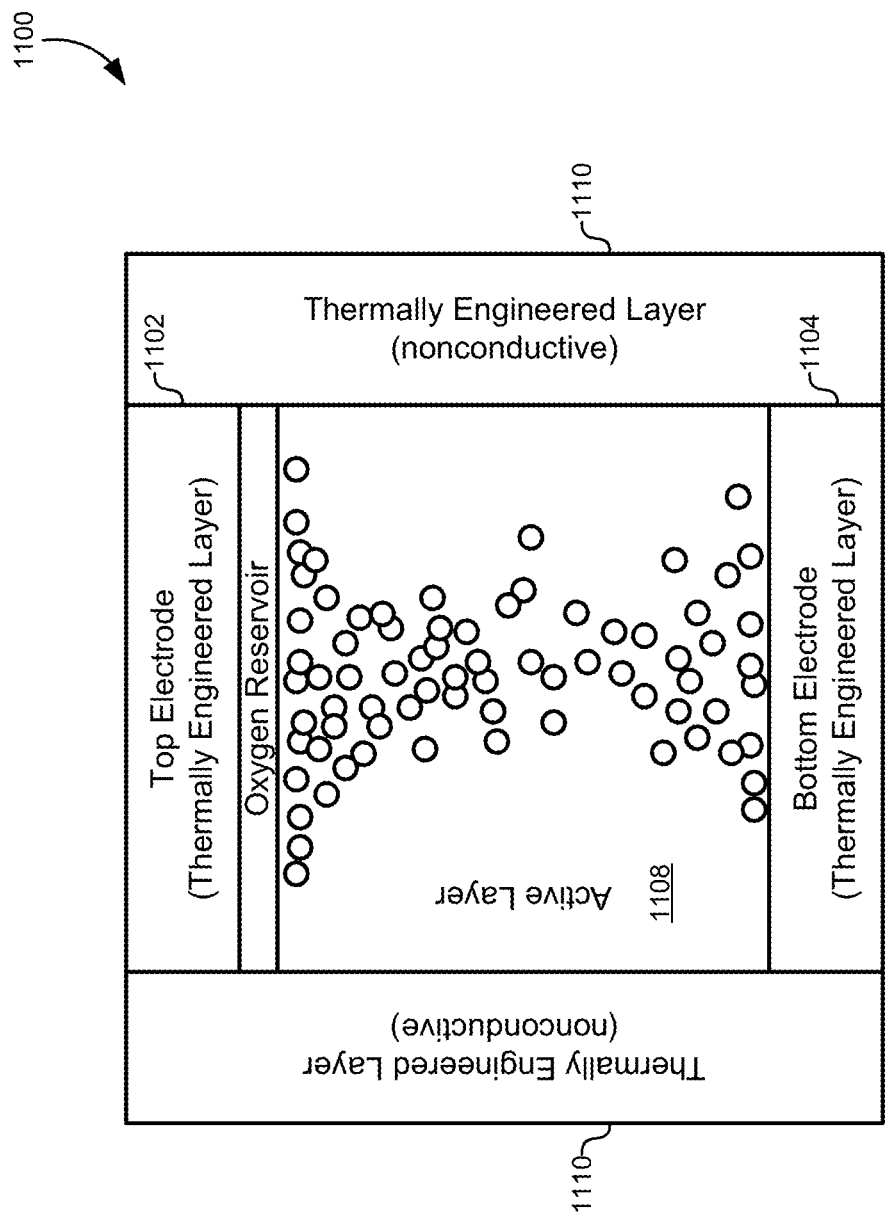
FIG. 11 illustrates a ReRAM device using a combination of different thermally engineered layers, according to some embodiments.

FIG. 11 illustrates a ReRAM device 1100 using a combination of different thermally engineered layers, according to some embodiments. This ReRAM device 1100 represents a combination of various thermally engineered layers described above. In this configuration, the top electrode 1102 and/or the bottom electrode 1104 may be fabricated using electrically conductive and thermally conductive material to act as thermally engineered layers. Additionally, the entire ReRAM device 1100 may be wrapped inside of a thermally engineered layer 1110. FIG. 11 may be considered a vertical cross-section of the ReRAM device 1100. As described above, the thermally engineered layer 1110 may be fabricated using a material that is electrically nonconductive to avoid shorting the top electrode 1102 to the bottom electrode 1104.

Figure 12:
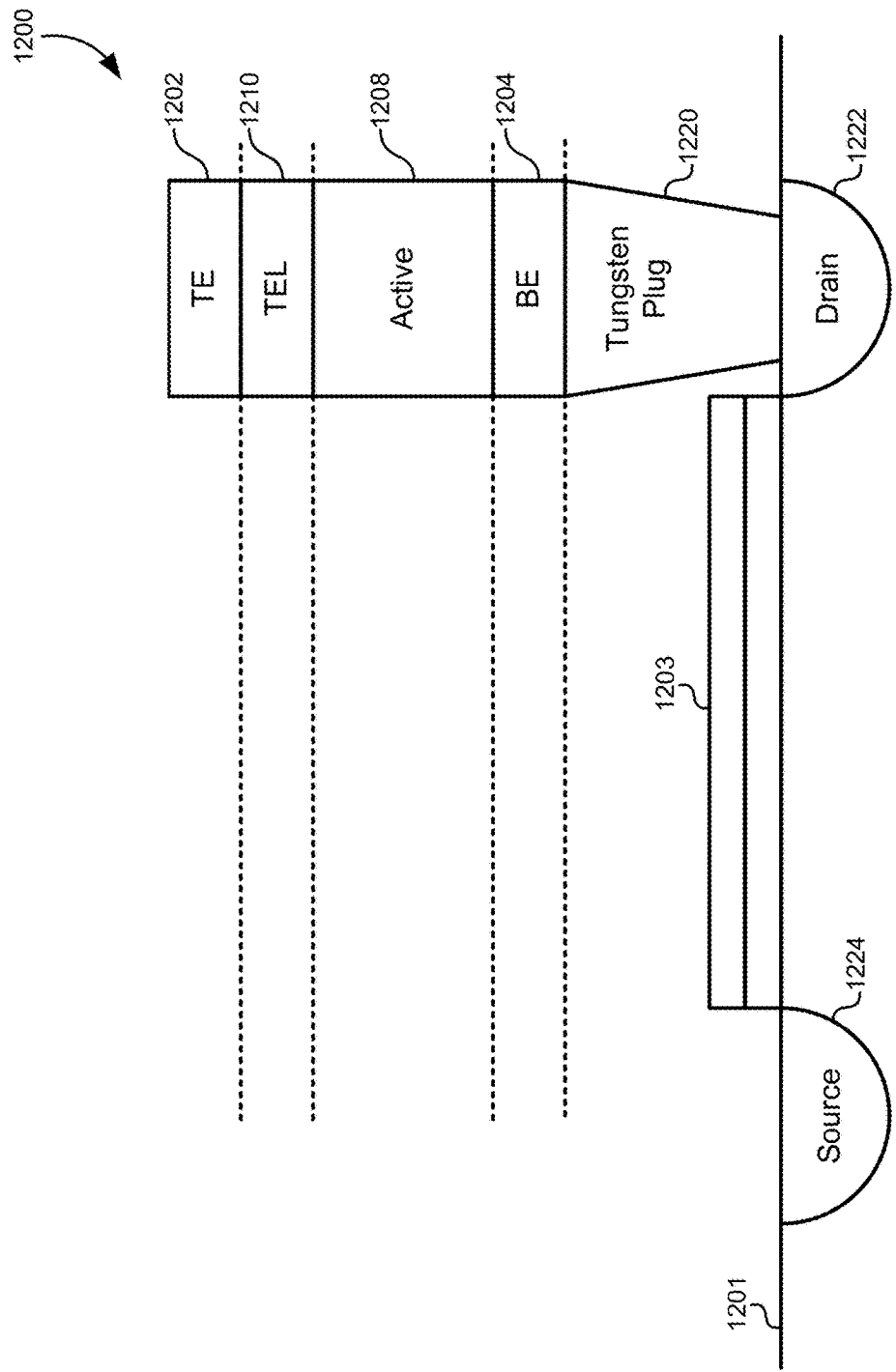
FIG. 12 illustrates layers of a semiconductor device that may implement a two-terminal selector/access device or an access transistor (3-terminal device) and a memory device in a neural network, according to some embodiments.

FIG. 12 illustrates layers of a semiconductor device that may implement a two-terminal selector/access device or an access transistor (3-terminal device) and a memory device in a neural network, according to some embodiments. Recall from FIG. 1 that each memory element in a neural network may include a selector/access device and a memory device. The selector device serves to isolate the memory device from voltages on the word line and/or bit line when that particular memory element is not being selected. In FIG. 12, a substrate 1201 may include a doped source region 1224 and a doped drain region 1222. Gate and oxide layers 1203 may create a controllable channel between the source region 1224 and the drain region 1222 to form a transistor. This transistor may act as a selector device for the memory element. Other embodiments may use different devices for the selector device, such as an MIEC selector, an ovonic threshold switch, a tunneling-selector, a Mott-selector, to name a few.

After the drain region 1222 is formed, a VIA may be created in a subsequent layer and filled with a tungsten plug 1220. A bottom electrode 1204 may be deposited on top of the tungsten plug 1220. The bottom electrode 1204 may also be referred to as a "second electrode" to distinguish it from a top, or "first" electrode. The bottom electrode 1204 may be fabricated from an alloyed metal to achieve high thermal conductance, such as titanium nitride (TiN), platinum Pt, TaN, W, and even alloyed with other nobles, such as gold metals. The bottom electrode 1204 may be deposited on the plug 1220 using a PVD/ALD deposition process to connect the memory cell to the drain region 1222 of the underlying access/selector transistor. In some embodiments, a thin, thermally engineered layer with a high thermal conductance may be deposited between the bottom electrode 1204 and the tungsten plug 1222.

After the bottom electrode 1204 is deposited, the active layer 1208 may be deposited with any combination of thermally engineered layers in any of the configurations described above. In the particular example of FIG. 12, the active layer 1208 may be deposited first, and then a thermally engineered layer 1210 may be deposited on top of the active layer 1208 using an active layer deposition process (ALD/PVD). Optionally, some embodiments may dope the active layer 1208 to improve the variability of the filament as it is formed. The top electrode 1202 can then be capped on top of the thermally engineered layer 1210 using a metal electrode, such as Pt, TiN, W, TaN, Ta, and/or the like. Alternatively, the thermally engineered layer 1210 may be deposited on top of the bottom electrode 1204, and the active layer 1208 may be deposited on top of the thermally engineered layer 1210. Other embodiments may include thermally engineered layers on both sides of the active layer 1208.

Figure 13:
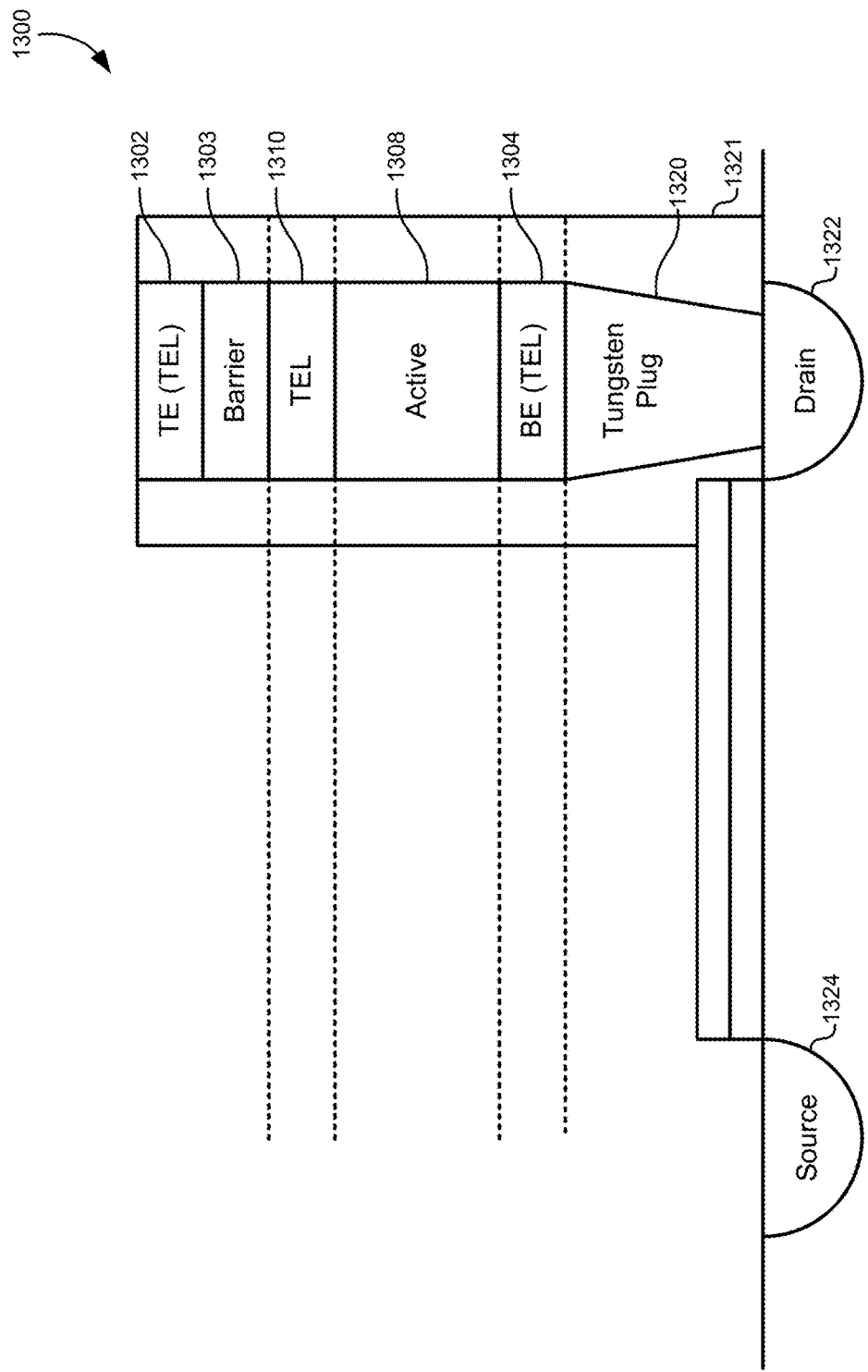
FIG. 13 illustrates another configuration for fabricating various embodiments of a selector device and a memory device using thermally engineered layers, according to some embodiments.

FIG. 13 illustrates another configuration for fabricating various embodiments of a selector device and a memory device using thermally engineered layers, according to some embodiments. In this example, thermally engineered layers may be placed at any locations in the layer stack of the memory device. In this example, the top electrode 1302 and/or the bottom electrode 1304 may be implemented using the thermally conductive materials described above to act as a thermally engineered layer. Other layers may be added into the device, such as the thermally engineered layer 1310 between the top electrode 1302 and the active layer 1308. Other layers may also be added between the active layer 1308 and the bottom electrode 1304.

Some embodiments may also include an additional thermally engineered layer 1321 that surrounds the memory device instead of a standard interlayer dielectric. For example, the surrounding cell structure can be patterned using a special mask so that an insulating thermally engineered layer 1321 surrounds the cell and acts as a heat sink around the exterior of the active layer 1308. This may correspond to various embodiments described above where the thermally engineered layer 1321 surrounds the active layer 1308 around the sides.

Some embodiments may also include an optional barrier layer 1303 fabricated from an insulating material. The barrier layer 1303 may form a capacitance/voltage divider and tunneling barrier (for the tuning of the ON/OFF ratio of the device) on top/bottom of the active layer 1308. This may be modeled as two series-connected capacitors that divide the voltage between the top electrode 1302 and the bottom electrode 1304. This adds additional control to the voltage being applied across the active layer 1308. The smaller, controlled voltage slows down the ionic movement in the active layer 1308 and further serves to make the response of the memory device more symmetric and linear.

Although the embodiments described herein use thermally engineered layers for ReRAM memory devices in neural networks, these specific embodiments have been provided only by way of example to provide an enabling disclosure and are not meant to be limiting. The use of thermally engineered layers may extend into other types of memories to achieve similar results.

Figure 14:
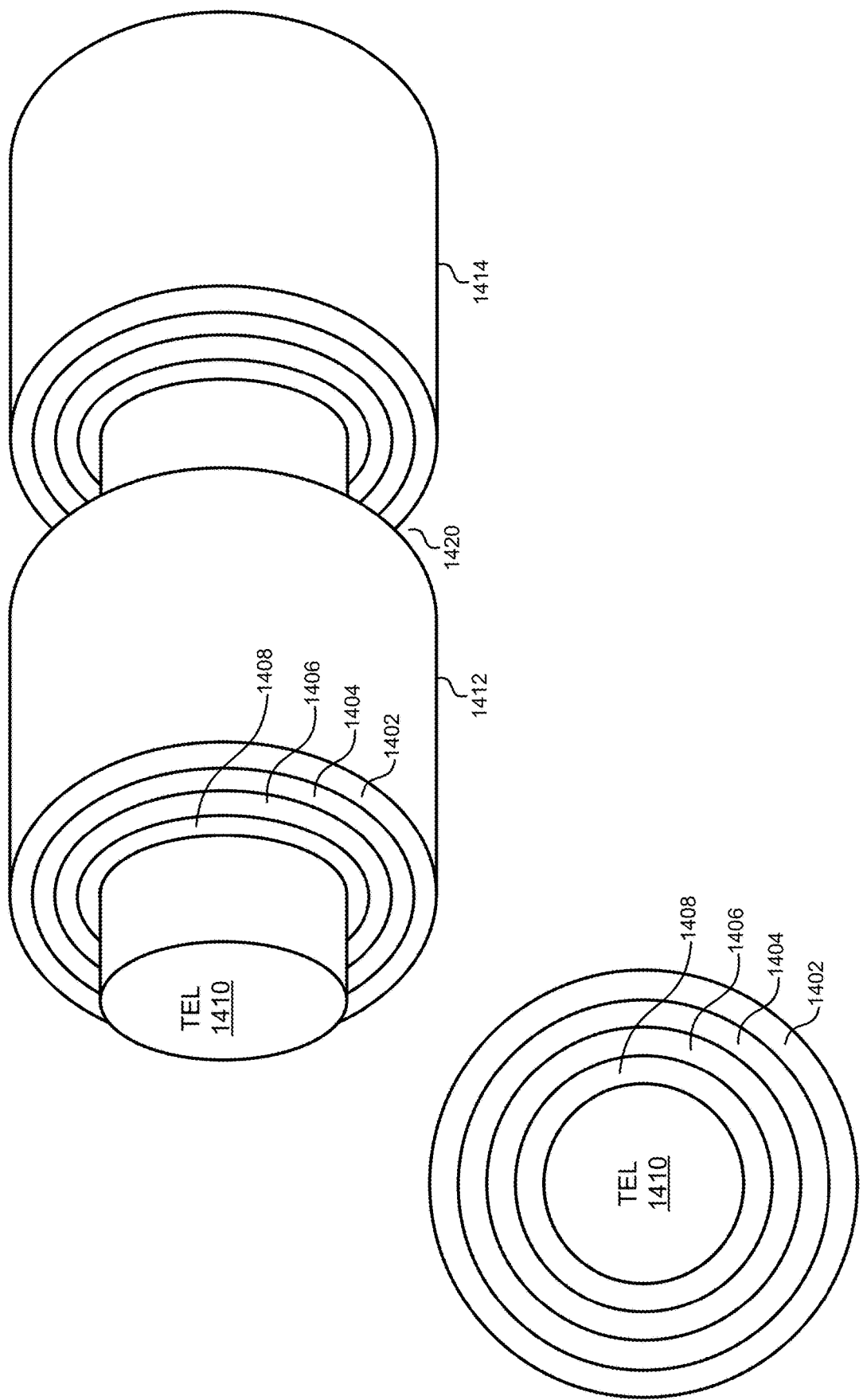
FIG. 14 illustrates a diagram of a 3D RRAM memory build based on the 3D NAND Flash memory.

FIG. 14 illustrates a diagram of a 3D RRAM memory build based on the 3D NAND Flash memory. A traditional Flash memory includes multiple layers in a cylindrical geometry that are etched into sections for each memory cell. A single cylinder may be etched into, for example, 128 individual memory cells. Instead of the polycrystalline channel used in existing NAND Flash, a thermally engineered layer that acts as an electrode may be incorporated in the case of the thermally engineered 3D RRAM array, according to some embodiments. The thermally engineered layer technology described above can be integrated into the Flash-like 3D RRAM memory architecture to act as a heat sink and make the RRAM formation and potentiation process more controllable and reliable.

In FIG. 14, a 3D RRAM memory cylinder may include a core comprising a thermally engineered layer 1410 similar to the embodiments described above. For example, the thermally engineered layer 1410 may include any material having a thermal conductivity of approximately 0.8 W/cmK or more. Surrounding the thermally engineered layer/inner electrode 1410 is a high-K oxide 1408, such as $Ta_2O_5$. Surrounding the high-K oxide 1408 is a heavily sub-stoichiometric oxide 1406, such as $TaO_x$ characterized with very high-K value (higher than the other two layers), followed by a second outer high-K 1404, such as such as $Ta_2O_5$. Another thermally engineered layer/electrode 1402 may surround each of the memory bits.

In addition to providing a thermally engineered core and external coating, some embodiments may also fill gaps between individual bits with thermally engineered layers. For example, FIG. 14 shows a first bit 1412 and a second bit 1414 separated by a gap 1420. Some embodiments may fill the gap 1420 with a thermally engineered layer to thermally insulate each of the bits 1412, 1414 and provide a heat sink that surrounds each of the bits 1412, 1414 entirely. The thermally engineered layer between the gap 1420 may be filled after the gap 1420 is etched out of the 3D RRAM cylinder similar to classical 3D NAND Flash architecture.

Figure 15:
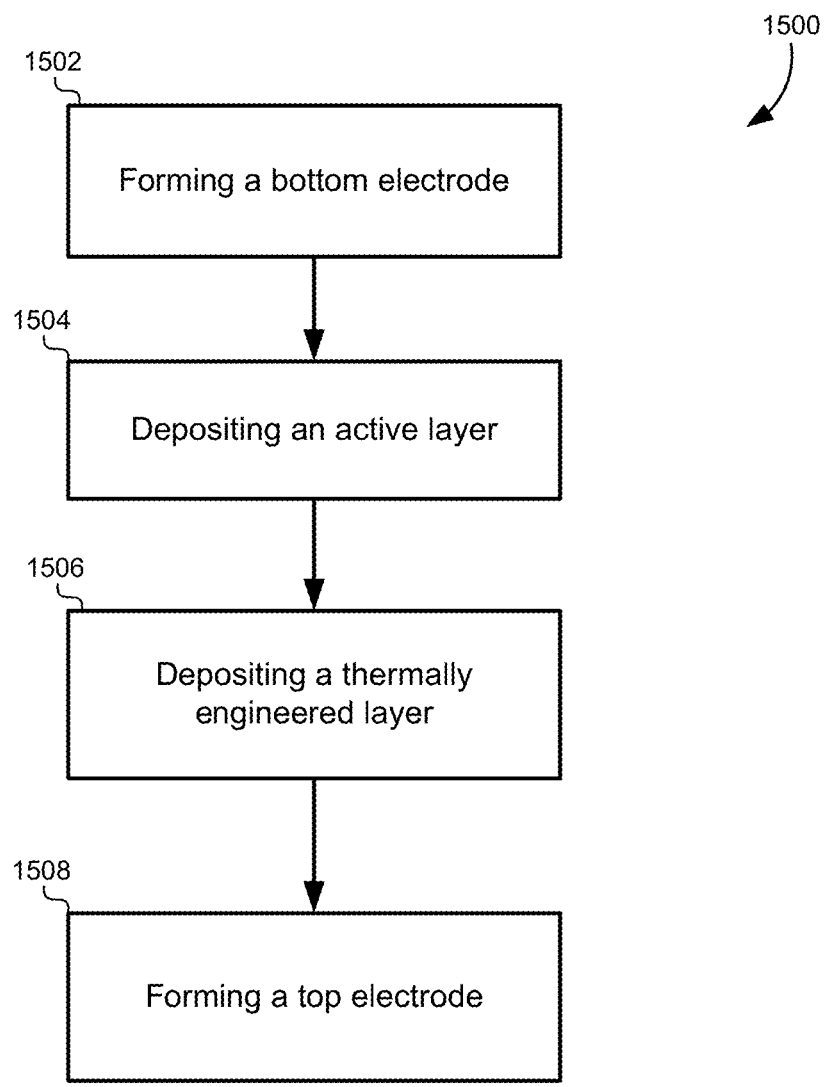
FIG. 15 illustrates a flowchart of a method for fabricating a ReRAM device using thermally engineered layers, according to some embodiments.

FIG. 15 illustrates a flowchart of a method for fabricating a ReRAM device using thermally engineered layers, according to some embodiments. The method may include forming a bottom electrode (1502). The bottom electrode may also be referred to as a "second" electrode to distinguish it from the top, or "first" electrode. The bottom electrode may be formed from an alloyed metal to achieve high thermal conductance. The bottom electrode may be deposited using a PVD/ALD deposition process on a plug that connects the ReRAM device with the drain of an underlying transistor. As described above, the bottom electrode may be comprised of a thin, thermally engineered layer with high thermal conductance that is deposited on the bottom of a TiN metal electrode.

The method may also include depositing an active layer (1504). The active layer may be deposited as one or more layers. The active layer may be capped with a thermally engineered layer as illustrated and described in various embodiments above.

The method may additionally include depositing a thermally engineered layer (1506). The thermally engineered layer may be deposited in any of the locations described above in relation to the top/bottom electrodes and the active layer. Some embodiments may include more than one thermally engineered layer, and some may implement the thermally engineered layer as the electrodes themselves. The thermally engineered layer may be positioned such that it removes heat from a location where heat is concentrated in the active layer. The thermally engineered layer may be characterized as having a relatively high thermal conductance as described above. The thermally engineered layer may be deposited at any point during this method, including before the active layer, before the bottom electrode, and/or after the top electrode.

The method may further include forming a top electrode (1508). The top electrode may be placed on top of the active layer and/or a thermally engineered layer. The top electrode may be formed from Pt, TiN, W, TaN, Ta, or any other similar metal. Some embodiments may optionally include a barrier layer added between the top electrode and the thermally engineered layer.

It should be appreciated that the specific steps illustrated in FIG. 15 provide particular methods of fabricating a ReRAM device using thermally engineered layers according to various embodiments. Other sequences of steps may also be performed according to alternative embodiments. For example, alternative embodiments may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives. For example, some embodiments may alternatively or additionally deposit an electrically non-conductive, thermally engineered layer, drill a hole for to contact to the bottom electrode to drain, and then deposit bottom electrode.

Multi-Layer Active Region

The embodiments described above solve the problems of nonlinearity and asymmetry in the ReRAM device response by adding thermally engineered layers to act as heatsinks and prevent thermal feedback from accelerating the filament-formation process. This prevents the rapid breakdown of the active layer and makes the formation of the filament more controllable. The thermally engineered layers can be added in many different locations and/or configurations based on a desired temperature profile to be achieved in the active layer.

In addition to adding the thermally engineered layers, additional methods discussed in detail below may also be used to control the thermal feedback process and abruptness of the forming and potentiation process. Specifically, some embodiments may be used to control the locations at which the filament is formed in the active layer. By controlling the locations where a filament is formed, the overall response of the ReRAM device can be further controlled and adjusted towards the ideal linear and symmetric response. The embodiments described below build the active layer out multiple layers of materials that have high and/or low dielectric constants to control the locations where the filament is formed.

Figure 16:
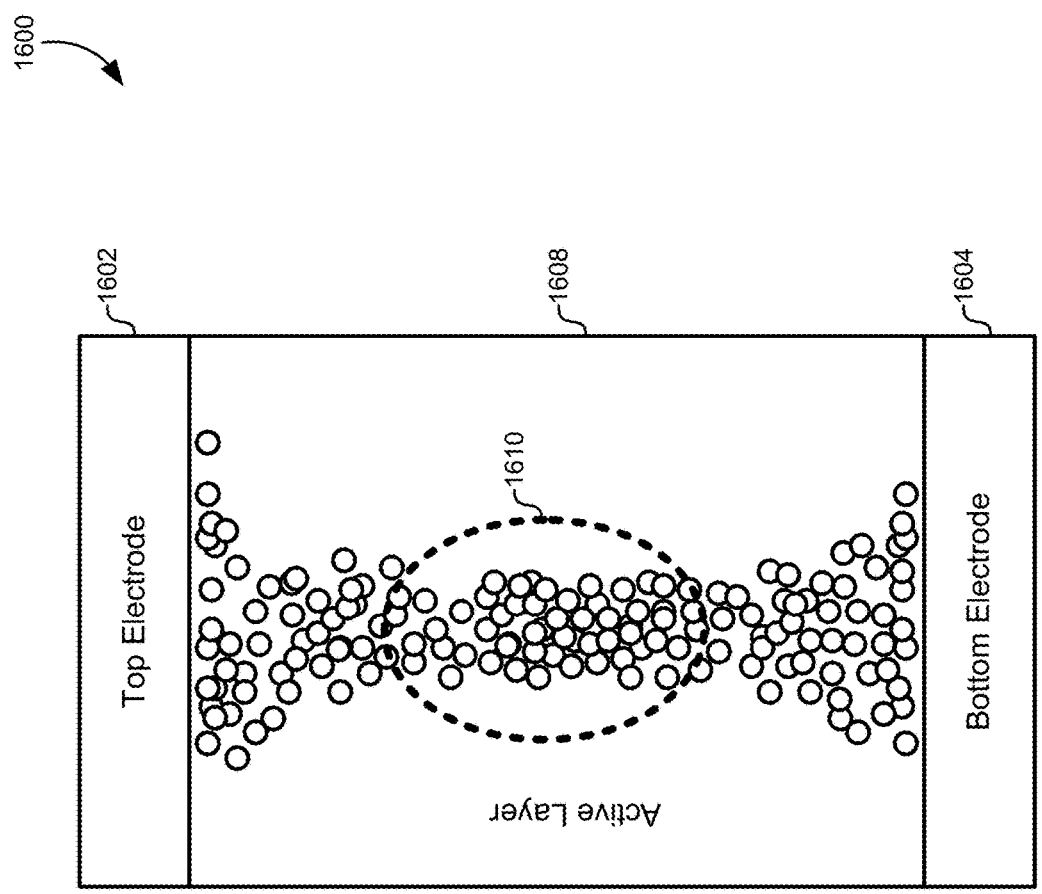
FIG. 16 illustrates a diagram of a ReRAM device where a filament is fully formed and conductive, according to some embodiments.

FIG. 16 illustrates a diagram of a ReRAM device 1600 where a filament is fully formed and conductive, according to some embodiments. It has been discovered that once the filament is formed in the central portion 1610 of the active layer 1608 between a top electrode 1602 and a bottom electrode 1604, it results in a strong jump in the conductance (compared to a "pristine" device) that spirals into positive feedback and breaks the device. The defects generated in the center portion 1610 conduct the majority of the current through the metal-insulator-metal device of the ReRAM device 1600. Turning back briefly to FIG. 3B, the initial and abrupt increase of curve 322 is caused by the corresponding initial and abrupt formation of the filament in the center portion 1610. The more linearly increasing portion of curve 322 (e.g., after 10 pulses) may be caused by the more gradual formation of the filament in the portions of the active layer 1608 closer to the top electrode 1602 and the bottom electrode 1604. This initial formation of defects in the center portion 1610 was found using a defect spectroscopy technique to determine when and where defects were formed in the active layer 1608.

Because the most nonlinear portion of the response curve of the ReRAM device 1600 is due to the initial and abrupt formation of the filament in the center portion 1610, the embodiments described herein may be configured to prevent and/or delay the formation of the filament in the center portion 1610. By doing so, the initial formation of the filament may take place closer to the top electrode 1602 and/or the bottom electrode 1604 where the filament formation is more linear and gradual in nature. When the filament later begins to form in the center portion 1610 of the active layer 1608, the process can be more controlled such that it does not form as abruptly as it has in traditional ReRAM devices.

Figure 17:
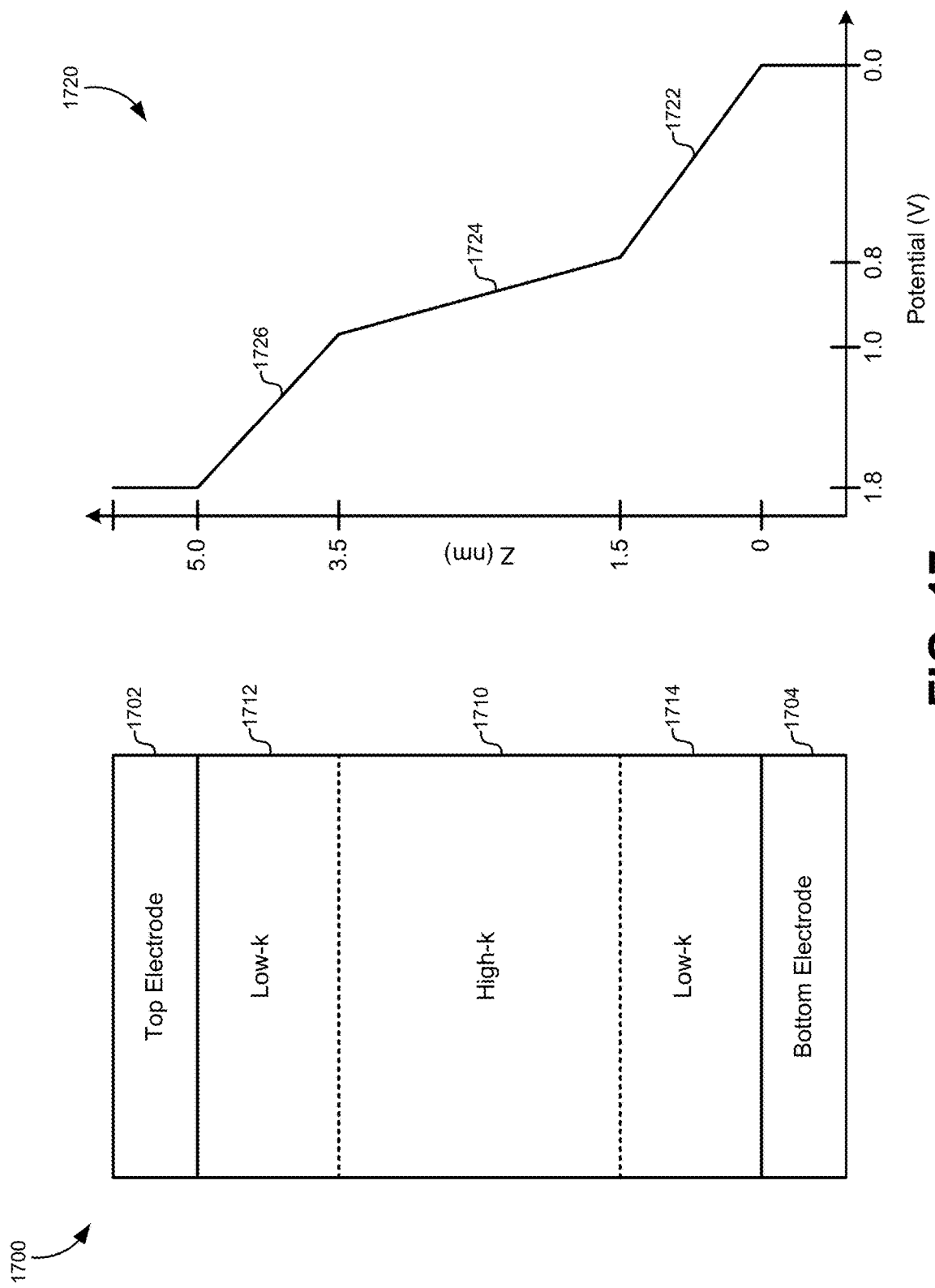
FIG. 17 illustrates a ReRAM device that uses a plurality of materials in the active layer to control where and when the filament begins to form, according to some embodiments.

FIG. 17 illustrates a ReRAM device 1700 that uses a plurality of materials in the active layer to control where and when the filament begins to form, according to some embodiments. The ReRAM device 1700 may include a middle highly sub-stochiometric active layer 1710 that has a relatively high dielectric constant with respect to other layers. The purpose of the middle active layer 1710 is to prevent the formation of defects in the center portion of the ReRAM device 1700 until defects have already formed elsewhere in the active layer. For example, the active layer may also include a top active layer 1712 and a bottom active layer 1714 that have relatively lower dielectric constants in comparison to the middle active layer 1710.

By using multiple layers in the active region, materials having appropriate dielectric constants can be selected to engineer the voltage drop within the ReRAM device 1700, and thereby control when and where the majority of the conductive filament is formed. Graph 1720 in FIG. 17 illustrates how a potential of 1.8 V is distributed across the active layer. Previously, when the active layer comprised a uniform material, the voltage would typically drop in a linear fashion uniformly across the active layer. However, when the active layer is divided into the bottom active layer 1714, the middle active layer 1710, and the top active layer 1712 having different dielectric constants, the voltage distribution across the active layer can vary across each region. Section 1722 of the graph 1720 corresponds to a voltage drop across the bottom active layer 1714 having a low dielectric constant. Similarly, section 1726 of the graph 1720 corresponds to a voltage drop across the top active layer 1712 also having a high-K but lower dielectric constant compared the inner layer. Section 1724 corresponds to the voltage drop across the middle active layer 1710. Notice that the majority of the voltage drop across the ReRAM device 1700 is concentrated in the top active layer 1712 and the bottom active layer 1714 having significantly lower dielectric constants with respect to the middle active layer 1710. A much smaller portion of the voltage drop is concentrated in the middle active layer 1710 with the very high dielectric constant. Note that the top active layer 1712 in the bottom active layer 1714 referred to as "low-K" only relative to the middle active layer 1710. In general, these layers 1712, 1714 may also be relatively high-K compared to other materials.

Figure 18:
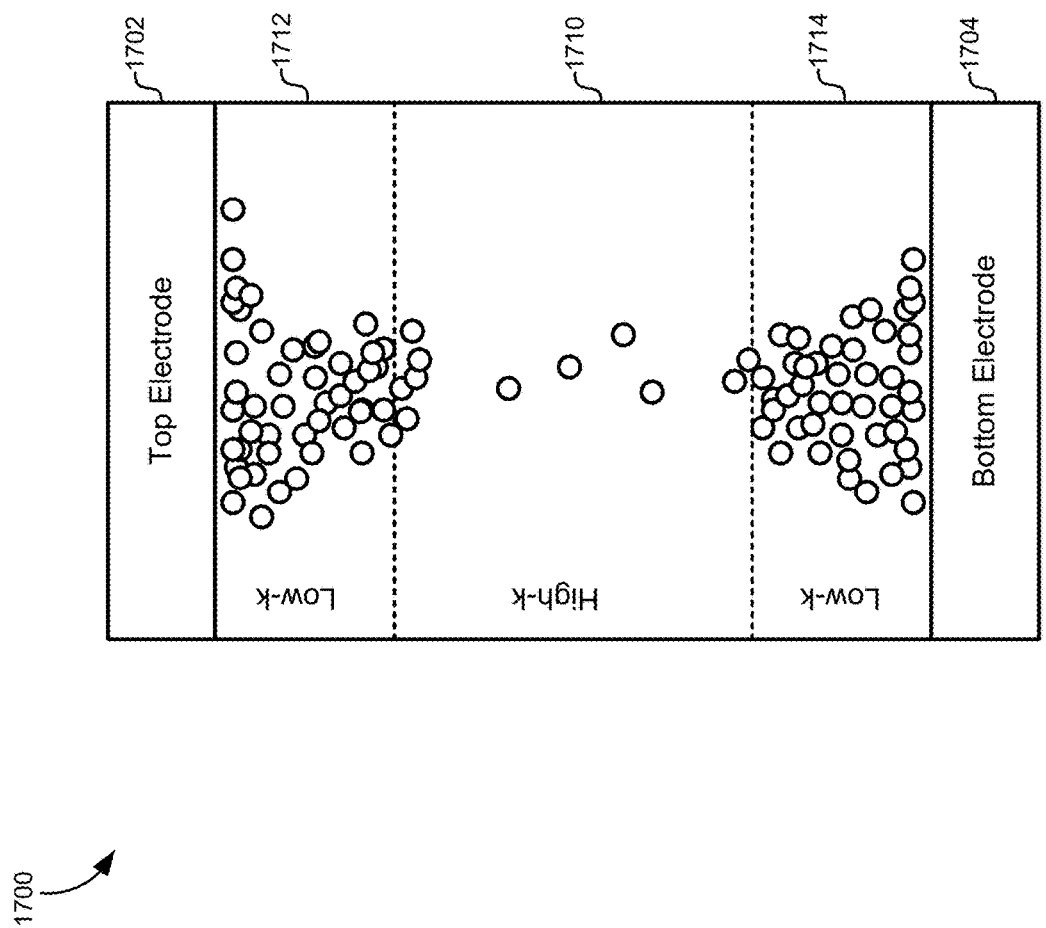
FIG. 18 illustrates the filament beginning to form in the top active layer and the bottom active layer in response to receiving the initial voltage pulses, according to some embodiments.

As the voltage is concentrated in the top active layer 1712 and the bottom active layer 1714, the majority of the filament will begin to form in the top active layer 1712 and the bottom active layer 1714 before any defects begin to form in the middle active layer 1710. FIG. 18 illustrates the filament beginning to form in the top active layer 1712 and the bottom active layer 1714 in response to receiving the initial voltage pulses, according to some embodiments. Because the voltage is concentrated in these layers, defects begin to form a conductive filament as soon as pulses begin to be received. In contrast, the very high dielectric constant of the middle active layer 1710 only allows relatively few defects to form in comparison to the number formed in the top active layer 1712 and/or the bottom active layer 1714. Essentially, the high dielectric constant prevents defection forming in the middle active layer 1710 until more voltage pulses have been received. Because the filament formation in the top active layer 1712 and the bottom active layer 1714 is more linear, the initial formation of the filament no longer exhibits and abrupt increase in conductivity that was common in previous ReRAM devices.

Figure 19:
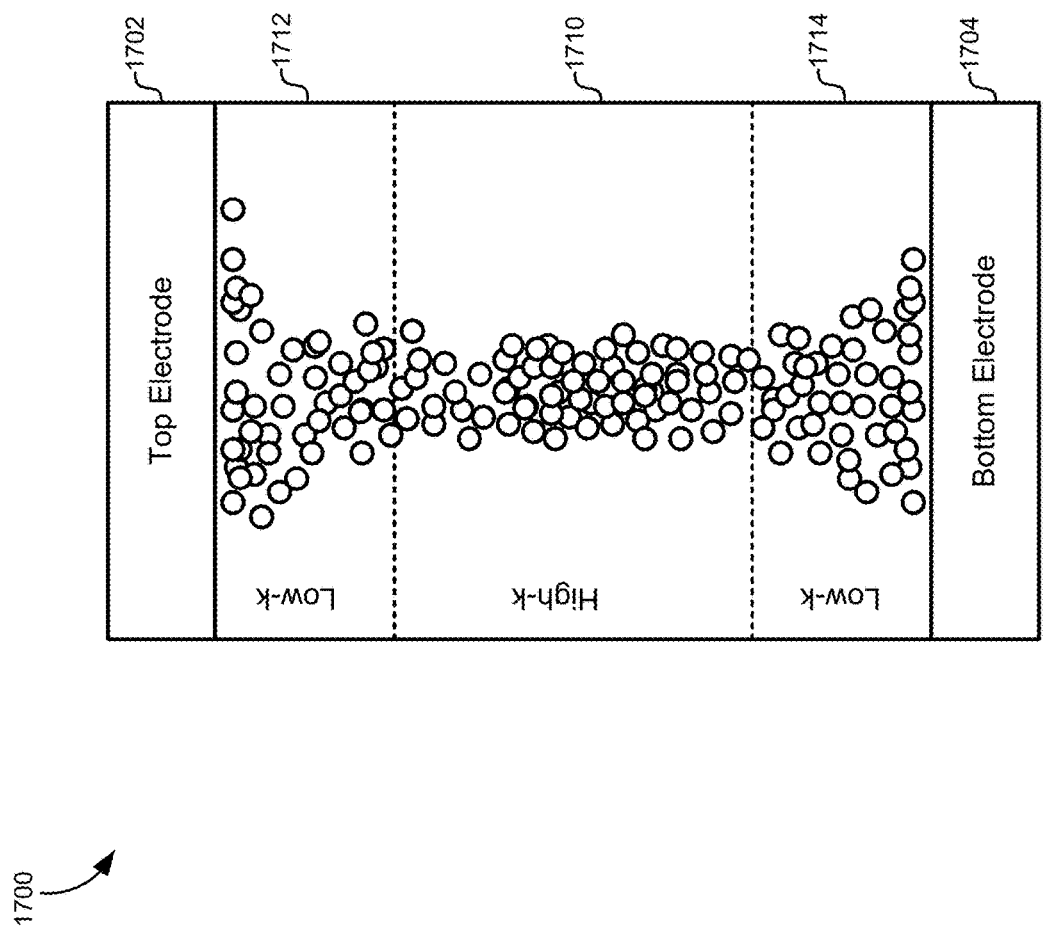
FIG. 19 illustrates the filament forming in the middle active layer, according to some embodiments.

After the filament is formed in the top active layer 1712 and/or the bottom active layer 1714, the filament may then begin to form in the middle active layer 1710. FIG. 19 illustrates the filament forming in the middle active layer 1710, according to some embodiments. Because the filament has already formed in the top active layer 1712 and the bottom active layer 1714, the filament is completed in the middle active layer 1710 without the abrupt change that typically occurred when the filament was first formed in the center portion of the active layer. To further control the speed with which the filament forms in the middle active layer 1710, some embodiments may also include a thermally engineered layer that is wrapped around the middle active layer 1710. This prevents any thermal feedback from accelerating the formation of the filament in the middle active layer 1710, and provides an even more linear response.

The width of each of the active layers may be determined in relation to the overall height of the active layer. In the example of FIG. 17, the active layer is approximately 5 nm wide. The top active layer 1712 and the bottom active layer 1714 are each 1.5 nm high, while the middle active layer 1710 is 2.0 nanometers high. These approximate ratios may be used for active layers with different total heights, such as 10 nm or more. In some embodiments, the widths of each of the bottom active layer 1714 and the top active layer 1712 may be between approximately 20% and 60% of the total width of the active layer. The width of the middle active layer 1710 may also be between 20% and 60% of the total width of the active layer. The thickness ratio between the middle active layer 1710 and the top/bottom active layers 1712, 1714 can be calculated based on a capacitance divider equation, given the dielectric constants of each layer, as well as the desired operating conditions and total thickness of the device.

The embodiments described above prevent the abrupt formation of the central portion of the filament by increasing the dialectic constant of the middle active layer in relation to the top/bottom active layers. This forces the filament to form slower in the middle region, and thereby reduces the abruptness with which the filament is formed. This makes the overall response of the ReRAM device more linear and more symmetric as described above.

Other embodiments may compensate for the abrupt formation of the filament in the middle active layer by preventing the ReRAM device from operating in the initial portion of the response curve that is highly nonlinear. Instead of slowing down and delaying the formation of the filament in the middle active layer, some embodiments may pre-form the filament or a highly defective (sub-stoichiometric oxide) layer that per se has a very high dielectric constant in the middle active layer 1710. This moves the operating region of the ReRAM device out of the nonlinear portion of the response curve into the more linear portion of the response curve.

Figure 20:
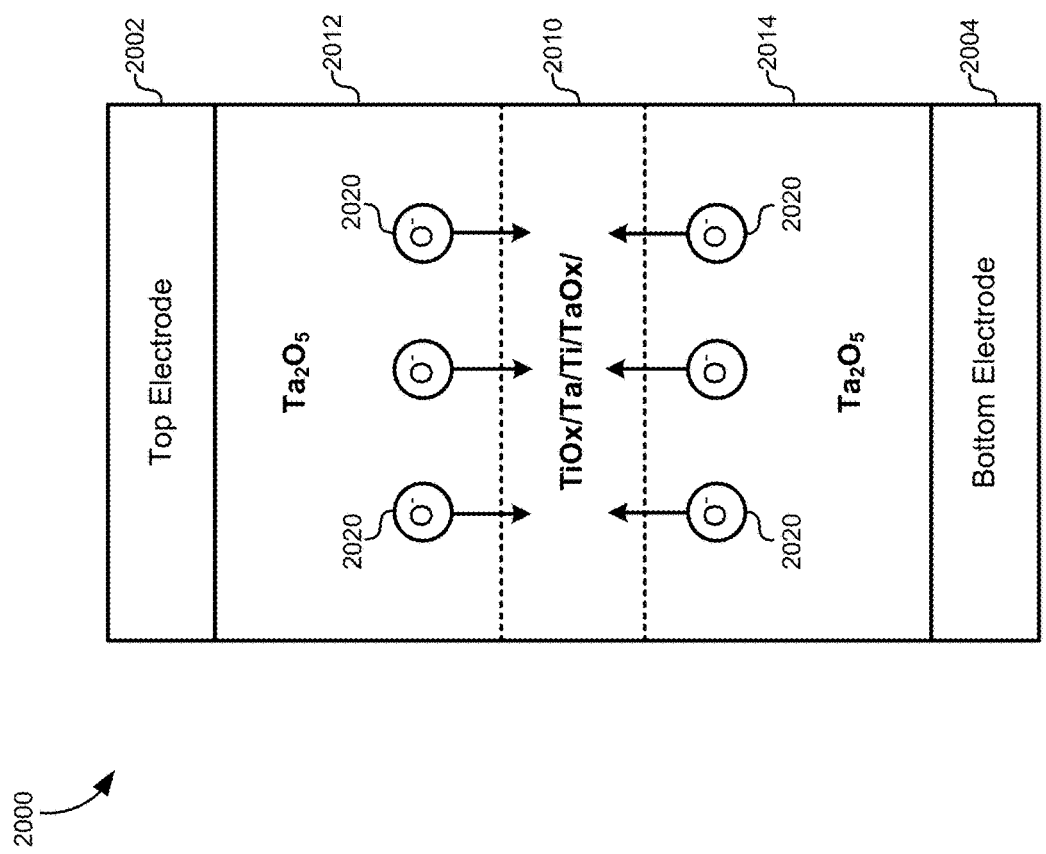
FIG. 20 illustrates a ReRAM device that may be used to pre-form a conductive filament in a middle active layer, according to some embodiments.

FIG. 20 illustrates a ReRAM device 2000 that may be used to pre-form a conductive filament in a middle active layer 2010, according to some embodiments. The ReRAM device 2000 may include a top electrode 2002 and a bottom electrode 2004 on either side of an active layer. Like previous embodiments, the active layer may include at least three different layered materials to form a top active layer 2012, a middle active layer 2010, and a bottom active layer 2014. However, instead of choosing materials based on their relative dielectric constants, this ReRAM device 2000 may tune highly sub-stoichiometric oxide materials 2010 or very thin metal using deposition conditions, which due to its low thickness does not have any equipotential properties but acts as an oxygen scavenger in other two layers. These materials may pre-form a conductive filament/highly defective layer and thus creating the middle active layer 2010.

For example, the top electrode 2002 and/or the bottom electrode 2004 may be fabricated using deposited platinum. The top active layer 2012 and/or the bottom active layer 2014 may be fabricated by depositing layers of $Ta_2O_5$. The middle active layer 2012 may comprise a highly sub-stoichiometric oxide such as TiOx or TaOx created by processing a very thin layer of tantalum (Ta), a layer of titanium (Ti), or a layer of another material with similar properties. Due to the high reactivity between the Ta/Ti of the middle active layer 2010 and oxygen that is freed from the $Ta_2O_5$ of the top active layer 2012 and/or the bottom active layer 2014, a substoichiometric oxide (e.g., TaOx) may be formed in the middle active layer 2010. Essentially, the Ta/Ti of the middle active layer 2010 may be reactive enough that it may oxidize quickly with free oxygen atoms 2020 absorbed from the top active layer 2012 and/or the bottom active layer 2014. This creates a very defective middle active layer 2010 characterized by a very high-K value and low voltage drop over it as discussed in FIG. 17 above.

Instead of using Ta/Ti for the middle active layer 2010 and relying on the reaction with the oxygen atoms 2020, some embodiments may use a Ta/Ti oxide to begin with. These three layers may be deposited as described above for the low-k/high-k/low-k dielectric embodiments, and thus the dimensions for the bottom active layer 2014, the middle active layer 2010, and/or the top active layer 2012 may be sized as described above. For example, some embodiments may use a bottom active layer 2012 with a thickness of approximately 4.0 nm, a middle active layer 2010 with a thickness of approximately 2.5 nm, and a top active layer 2012 with a thickness of approximately 4.0 nm. Each of these thickness may vary by up to 50% without restriction in various embodiments based on the desired operating conditions and the dielectric constants of the layers.

Figure 21:
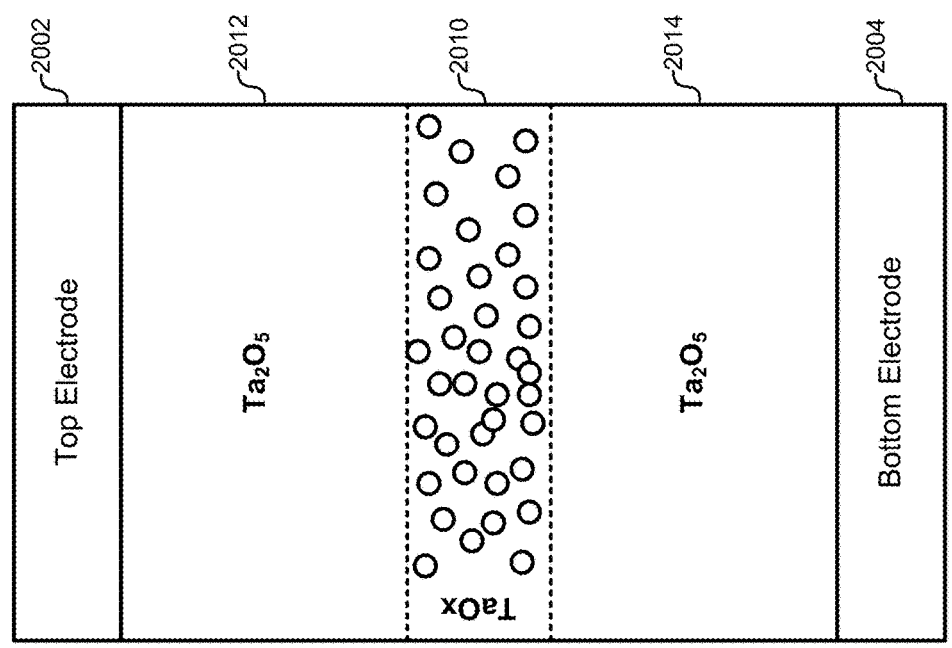
FIG. 21 illustrates an oxidized middle active layer where the defects have formed by processing conditions in a uniform manner over the whole layer in contrast to the ultra-dense defectivity observed in a conductive filament, according to some embodiments.

FIG. 21 illustrates an oxidized middle active layer 2010 where the defects have formed by processing conditions in a uniform manner over the whole layer in contrast to the ultra-dense defectivity observed in a conductive filament, according to some embodiments. In this case, instead of delaying and slowing the formation of the filament in the middle active layer 2010, these embodiments skip that process such that the highly-defective layer by nature has a very high-K value, which reduces the voltage drop of the middle portion of when a voltage is applied to the ReRAM device 2000. This bypasses the possibility of the abrupt jump due to the fast generation of defects in the device 2000 equivalent without highly defective layer 2010. The remaining portions of the filament can then begin to form in the bottom active layer 2014 and the top active layer 2012 where the process may be more linear and controlled.

Figure 22:
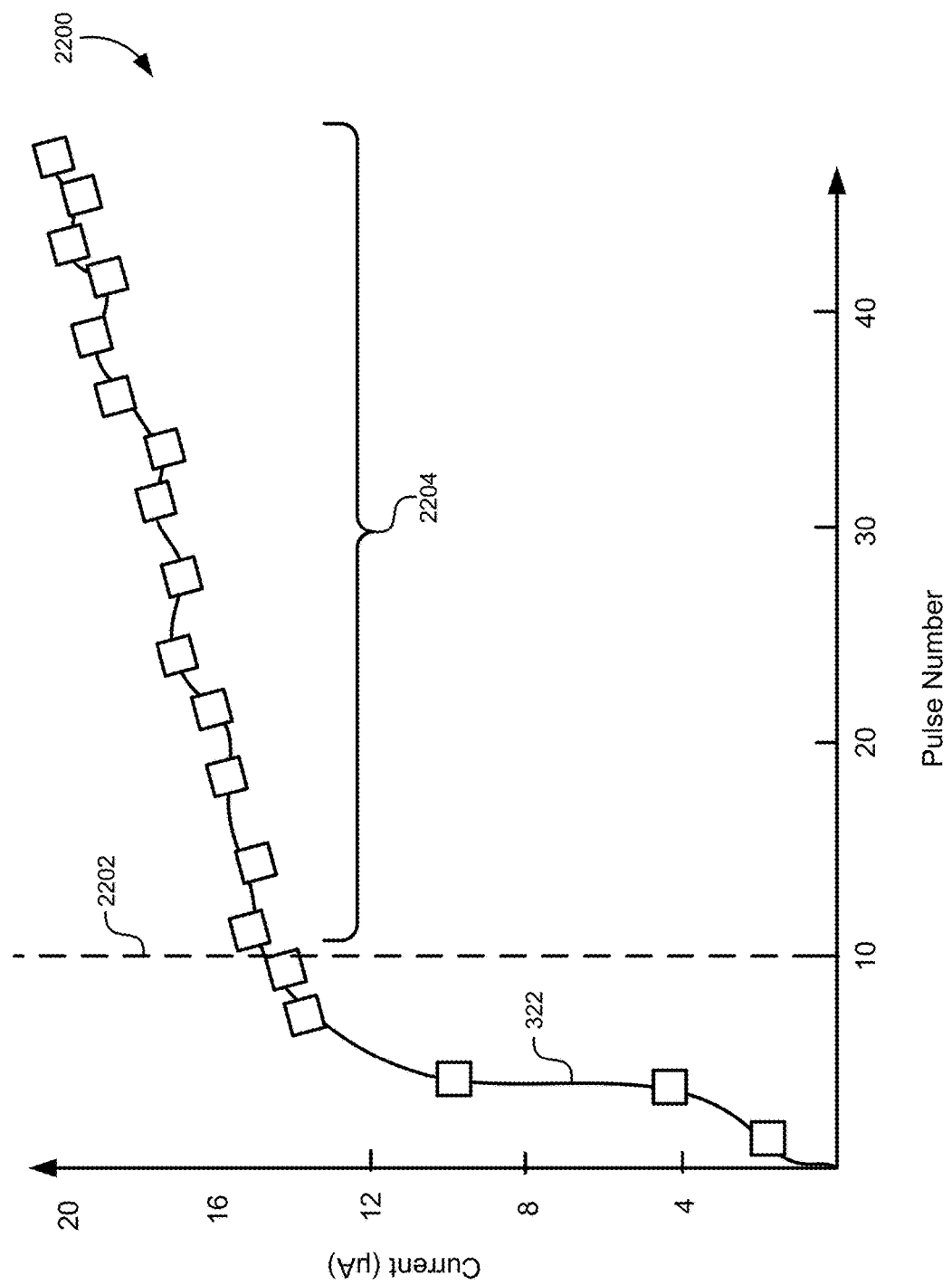
FIG. 22 illustrates the response curve from FIG. 3B when the middle layer of device is highly defective, equivalent to pre-formed in the middle active layer, according some embodiments.

FIG. 22 illustrates the response curve from FIG. 3B when the middle layer of device is highly defective, equivalent to pre-formed in the middle active layer, according some embodiments. As described above, the response curve 322 includes a very nonlinear region during an initial portion of the response curve 322. This nonlinear response is caused by the abrupt formation of the filament in the middle active layer. However, when the filament is pre-formed in the middle active layer, the starting point on the response curve 322 shifts over to location 2202 when voltage is applied. Therefore, as positive/negative pulses are received by the ReRAM device, the current may fluctuate within the linear region 2204 of the response curve 322. Note that although not entirely ideal, the portion of the response curve 322 in region 2204 is much more linear than the initial portion of the response curve 322.

Figure 23:
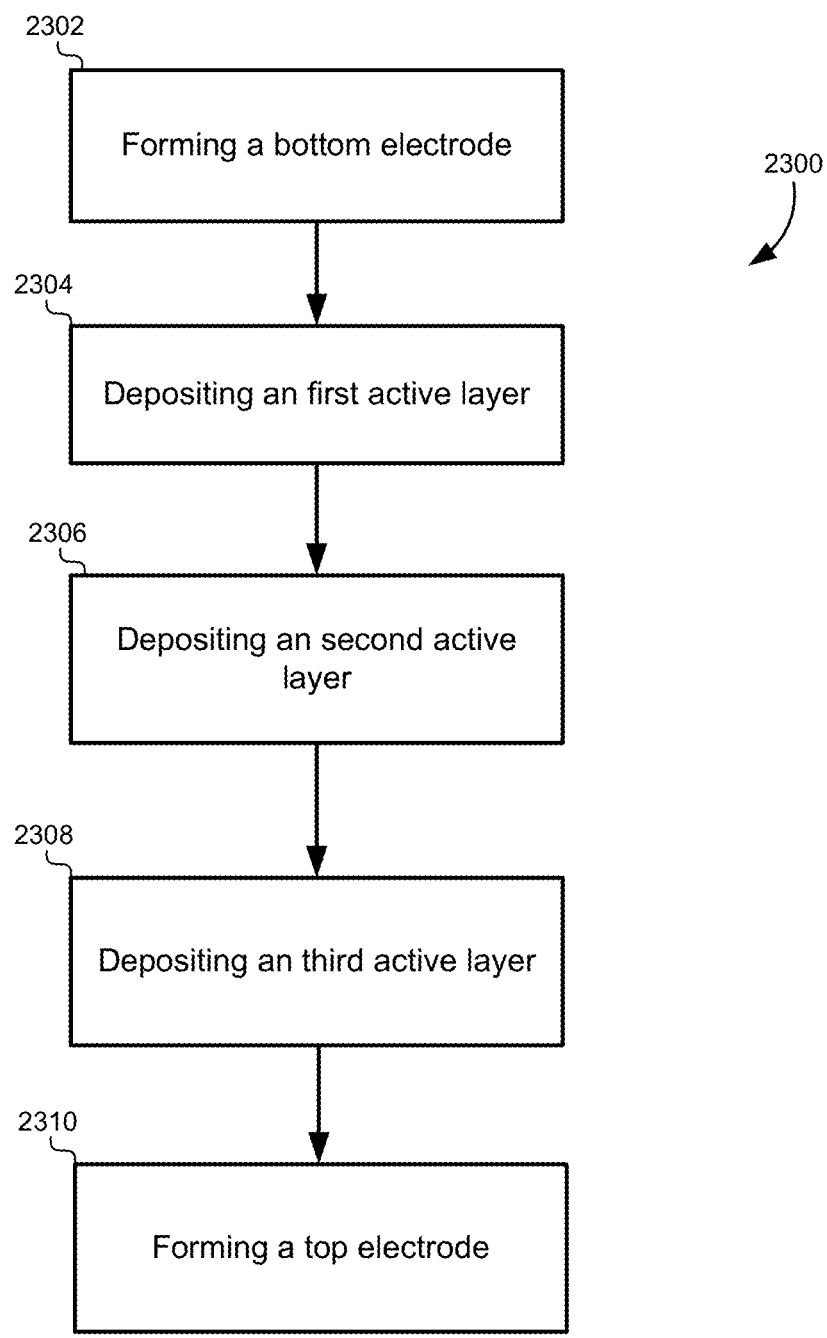
FIG. 23 illustrates a method of implementing a ReRAM device having multiple active layers, according to some embodiments.

FIG. 23 illustrates a method of implementing a ReRAM device having multiple active layers, according to some embodiments. The method may include forming a bottom electrode (2302). The bottom electrode may also be referred to as a "second" electrode to distinguish it from the top, or "first" electrode. The bottom electrode may be formed from an alloyed metal to achieve high thermal conductance. The bottom electrode may be deposited using a PVD/ALD deposition process on a plug that connects the ReRAM device with the drain of an underlying transistor. As described above, the bottom electrode may be comprised of a thin, thermally engineered layer with high thermal conductance that is deposited on the bottom of a TiN metal electrode.

The method may also include depositing a first active layer (2304), a second active layer (2306), and a third active layer (2308). These may also be referred to as a bottom active layer, a middle active layer, and a top active layer. In some embodiments, the first and third active layers may comprise materials having a relatively high dielectric constant, while the second active layer comprises a material having a relatively higher dielectric constant compared to that of the first and third active layers. The relative comparison of dielectric constants may cause a conductive filament to form in the first and third active layers before forming in the second active layer. In some embodiments, the first and third active layers may comprise materials that readily lose oxygen atoms, and the second active layer may comprise a material that reacts with the oxygen atoms to form an oxide. The second active layer may pre-form a conductive filament when forming the oxide. Thermally engineered layers may also be added in any locations as described above.

The method may further include forming a top electrode (2310). The top electrode may be placed on top of the active layer and/or a thermally engineered layer. The top electrode may be formed from Pt, TiN, W, TaN, Ta, TiSiN, TiAlN, TaSiN, Ir, RuOx, N, or other similar metals. Some embodiments may optionally include a barrier layer added between the top electrode and the thermally engineered layer.

It should be appreciated that the specific steps illustrated in FIG. 23 provide particular methods of implementing a ReRAM device having multiple active layers according to various embodiments. Other sequences of steps may also be performed according to alternative embodiments. For example, alternative embodiments may perform the steps outlined above in a different order. Moreover, the individual steps illustrated in FIG. 23 may include multiple sub-steps that may be performed in various sequences as appropriate to the individual step.

Furthermore, additional steps may be added or removed depending on the particular applications. One of ordinary skill in the art would recognize many variations, modifications, and alternatives.

Thermally Engineered Layers With Multiple Active Layers

The two solutions presented above for optimizing the operation of a ReRAM device may each be used independently and separately from each other. For example, some embodiments may use only thermally engineered layers, while other embodiments may forgo the use of thermally engineered layers and instead use multiple active layers. Each of these different solutions and the various embodiments for implementing each of these solutions may optimize individual aspects of the response curve of the ReRAM device.

In addition to using these solutions separately and independently, some embodiments may also combine aspects of each solution together into a single implementation. This allows a circuit designer to fine-tune the operation of the ReRAM device using individual aspects of the solutions described above. For example, some embodiments may add thermally engineered layers at certain locations to remove heat from the active layer, while also using multiple active layers to control the location and speed with which the filament is formed. Therefore, any of the placement options and orientations for the thermally engineered layers described above may be combined in any combination and without limitation with any of the multiple active layers described above.

Figure 24:
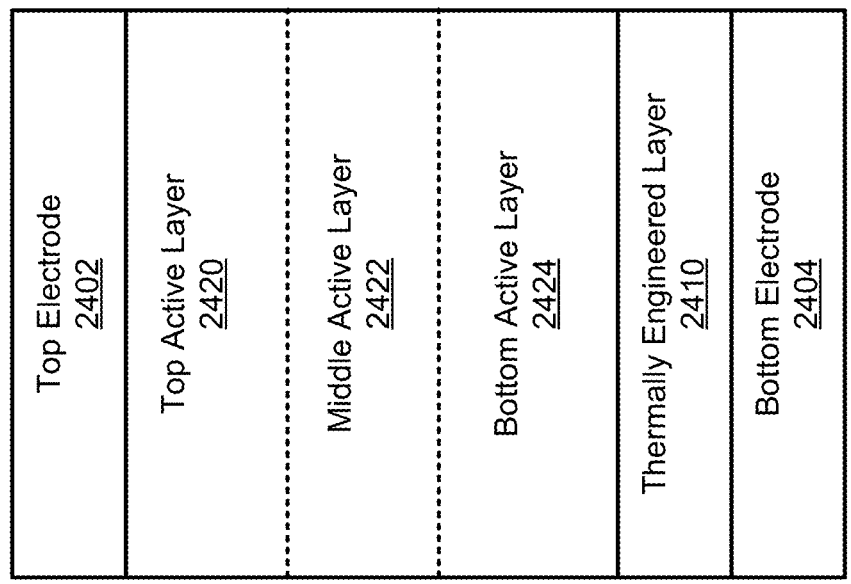
FIG. 24 illustrates a ReRAM device that includes a thermally engineered layer and multiple active layers, according to some embodiments.

FIG. 24 illustrates a ReRAM device 2400 that includes a thermally engineered layer 2410 and multiple active layers, according to some embodiments. The ReRAM device may include a top electrode 2402 and a bottom electrode 2404. A thermally engineered layer 2410 may be deposited between the bottom electrode 2404 and the active layer. Although not shown explicitly, some embodiments may place the thermally engineered layer 2410 between the top electrode 2402 and the active layer. The thermally engineered layer 2410 may operate as illustrated and described above in relation to FIG. 5. The ReRAM device 2400 may also divide the active layer into a top active layer 2420, a middle active layer 2422, and a bottom active layer 2424. These layers 2420, 2422, 2424 in the active layer may be configured as illustrated and described in relation to FIG. 17 based on dielectric constants to slow formation of the filament in the middle active layer 2422.

Figure 25:
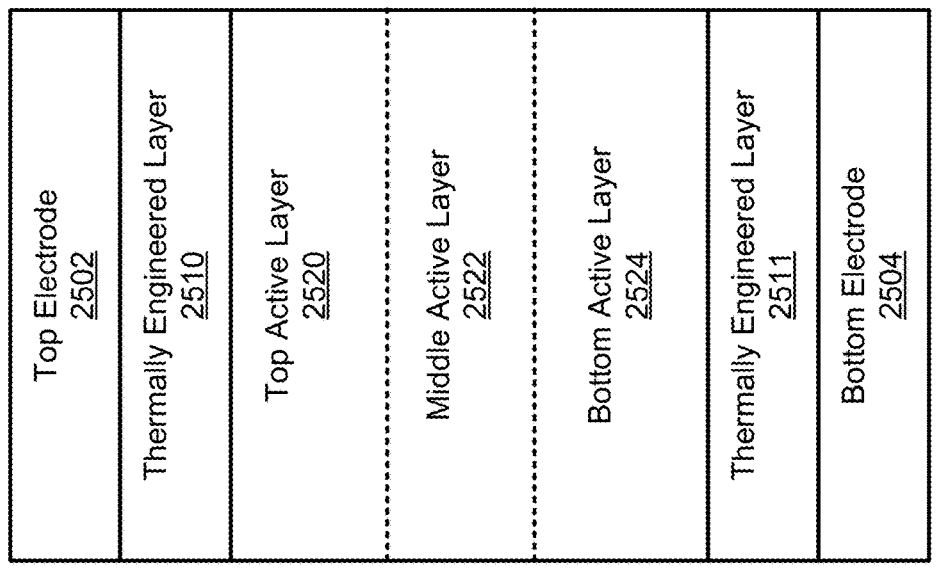
FIG. 25 illustrates a ReRAM device that includes multiple thermally engineered layers, according to some embodiments.

FIG. 25 illustrates a ReRAM device 2500 that includes multiple thermally engineered layers, according to some embodiments. The ReRAM device may include a top electrode 2502 and a bottom electrode 2504. A thermally engineered layer 2510 may be placed between the top electrode 2502 and the active layer, and another thermally engineered layer 2511 may be placed between the bottom electrode 2504 and the active layer. The thermally engineered layers 2510, 2511 may operate as illustrated and described above in relation to FIG. 6. The ReRAM device 2400 may also divide the active layer into a top active layer 2520, a middle active layer 2522, and a bottom active layer 2524. These layers 2520, 2522, 2524 in the active layer may be configured as illustrated and described above in relation to FIG. 17 based on dielectric constants to slow formation of the filament in the middle active layer 2522. Alternatively, these layers 2520, 2522, 2524 in the active layer may be configured as illustrated and described above in relation to FIGS. 21-22 to form an oxide in the middle active layer 2522 to pre-form the filament in the middle active layer 2522.

Figure 26:
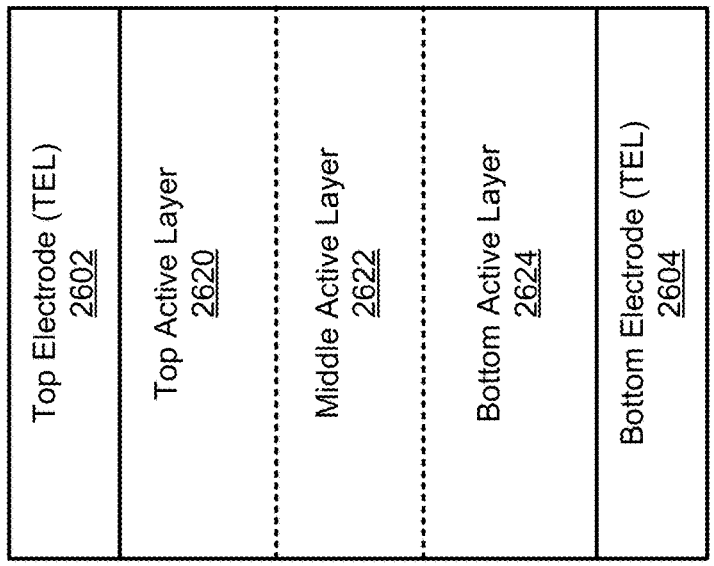
FIG. 26 illustrates a ReRAM device that incorporates thermally engineered layers as the electrodes, according to some embodiments.

FIG. 26 illustrates a ReRAM device 2600 that incorporates thermally engineered layers as the electrodes, according to some embodiments. The ReRAM device may include a top electrode 2602 and a bottom electrode 2604 that are made from thermally engineered materials having the properties described above. These electrodes 2602, 2604 may operate as illustrated and described above in relation to FIG. 7. The ReRAM device 2600 may also divide the active layer into a top active layer 2620, a middle active layer 2622, and a bottom active layer 2624. These layers 2620, 2622, 2624 in the active layer may be configured as illustrated and described above in relation to FIG. 17 based on dielectric constants to slow formation of the filament in the middle and outer active layers 2622, 2620, and 2624.

Figure 27:
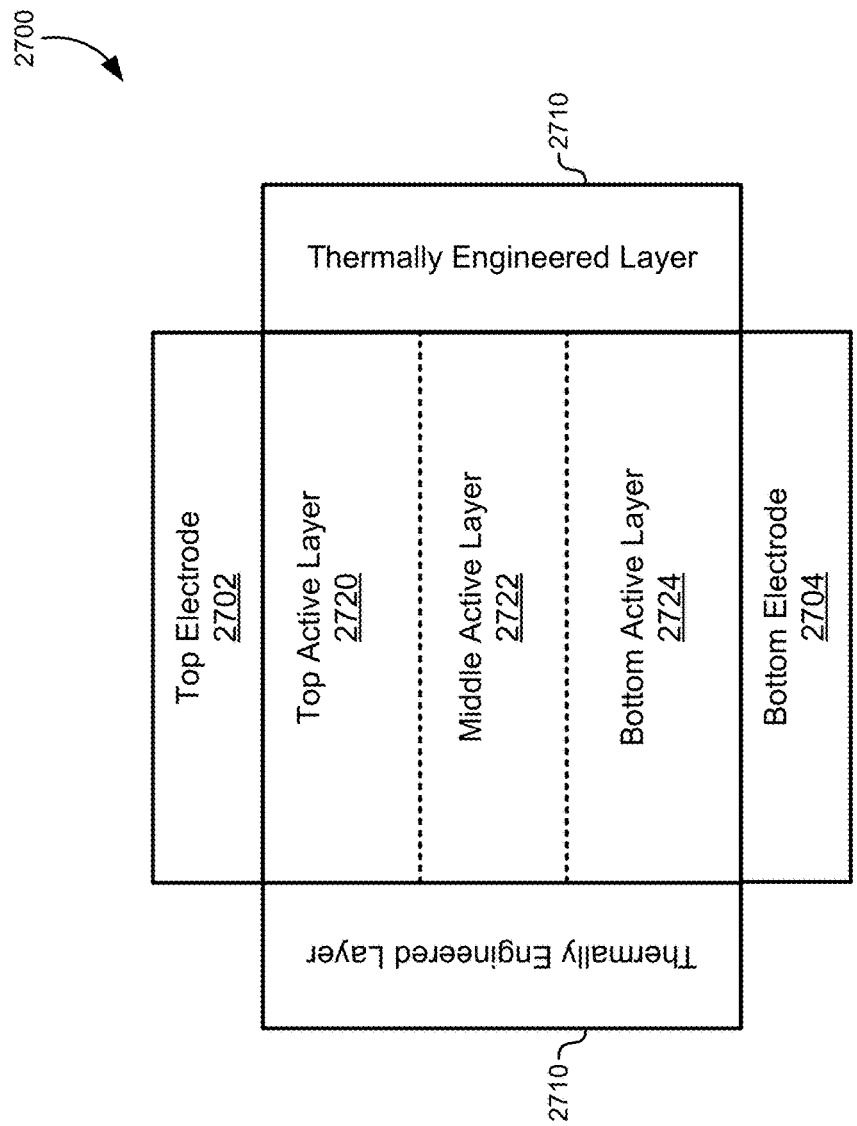
FIG. 27 illustrates a ReRAM device that wraps a thermally engineered layer around the ReRAM device, according to some embodiments.

FIG. 27 illustrates a ReRAM device 2700 that wraps a thermally engineered layer 2710 around the ReRAM device 2700, according to some embodiments. The thermally engineered layer 2710 may be wrapped around the active layer of the ReRAM device 2700 as illustrated and described above in relation to FIG. 8. At least a portion of the top electrode 2702 and the bottom electrode 2704 may be exposed. The ReRAM device 2700 may also divide the active layer into a top active layer 2720, a middle active layer 2722, and a bottom active layer 2724. These layers 2720, 2722, 2724 in the active layer may be configured as illustrated and described above in relation to FIG. 17 based on dielectric constants to slow formation of the filament in all active layers 2720, 2722, 2724.

Figure 28:
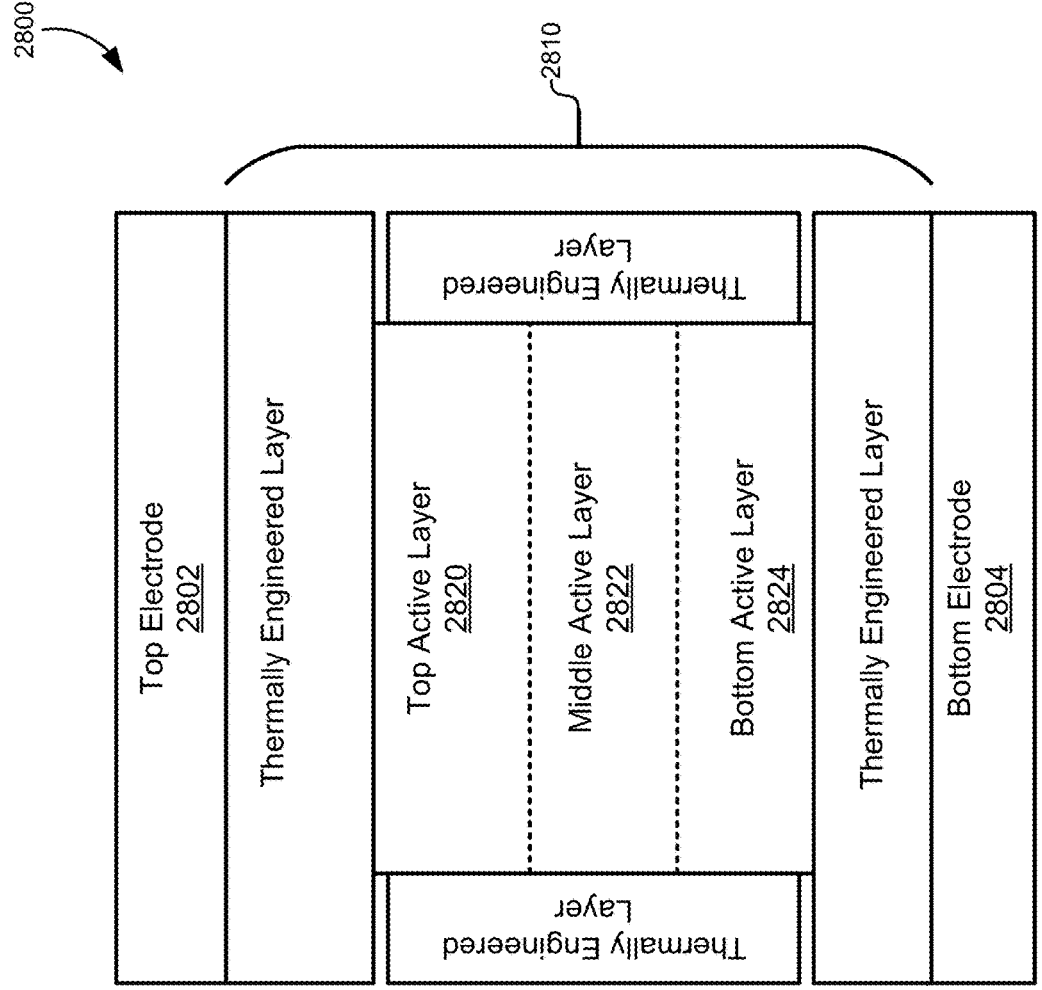
FIG. 28 illustrates a ReRAM device that encases the active layer in a thermally engineered layer, according to some embodiments.

FIG. 28 illustrates a ReRAM device 2800 that encases the active layer in a thermally engineered layer 2810, according to some embodiments. The thermally engineered layer 2810 may be wrapped around the active layer of the ReRAM device 2800 as illustrated and described above in relation to FIG. 9. The ReRAM device 2800 may also divide the active layer into a top active layer 2820, a middle active layer 2822, and a bottom active layer 2824. These layers 2820, 2822, 2824 in the active layer may be configured as illustrated and described above in relation to FIG. 17 based on dielectric constants to slow formation of the filament in the middle active layer 2822.

Figure 29:
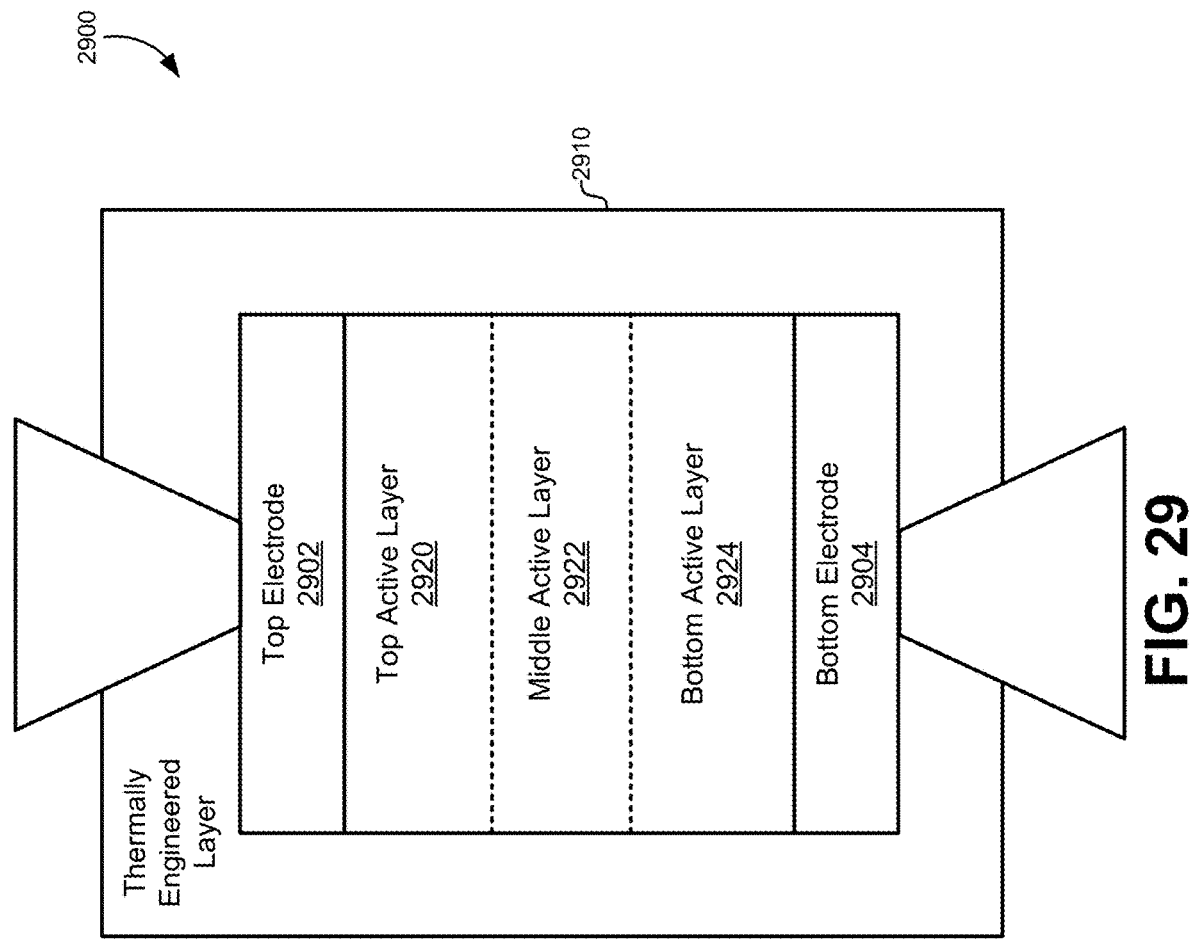
FIG. 29 illustrates a ReRAM device with a thermally engineered layer encasing the ReRAM device, according to some embodiments.

FIG. 29 illustrates a ReRAM device 2900 with a thermally engineered layer 2900 encasing the ReRAM device 2900, according to some embodiments. The thermally engineered layer 2910 may be wrapped around the active layer and the top electrode 2902 and the bottom electrode 2904 of the ReRAM device 2900 as illustrated and described above in relation to FIG. 10. The ReRAM device 2900 may also divide the active layer into a top active layer 2920, a middle active layer 2922, and a bottom active layer 2924. These layers 2920, 2922, 2924 in the active layer may be configured as illustrated and described above in relation to FIG. 17 based on dielectric constants to slow formation of the filament in the all active layers 2920, 2922, 2924.

Figure 30:
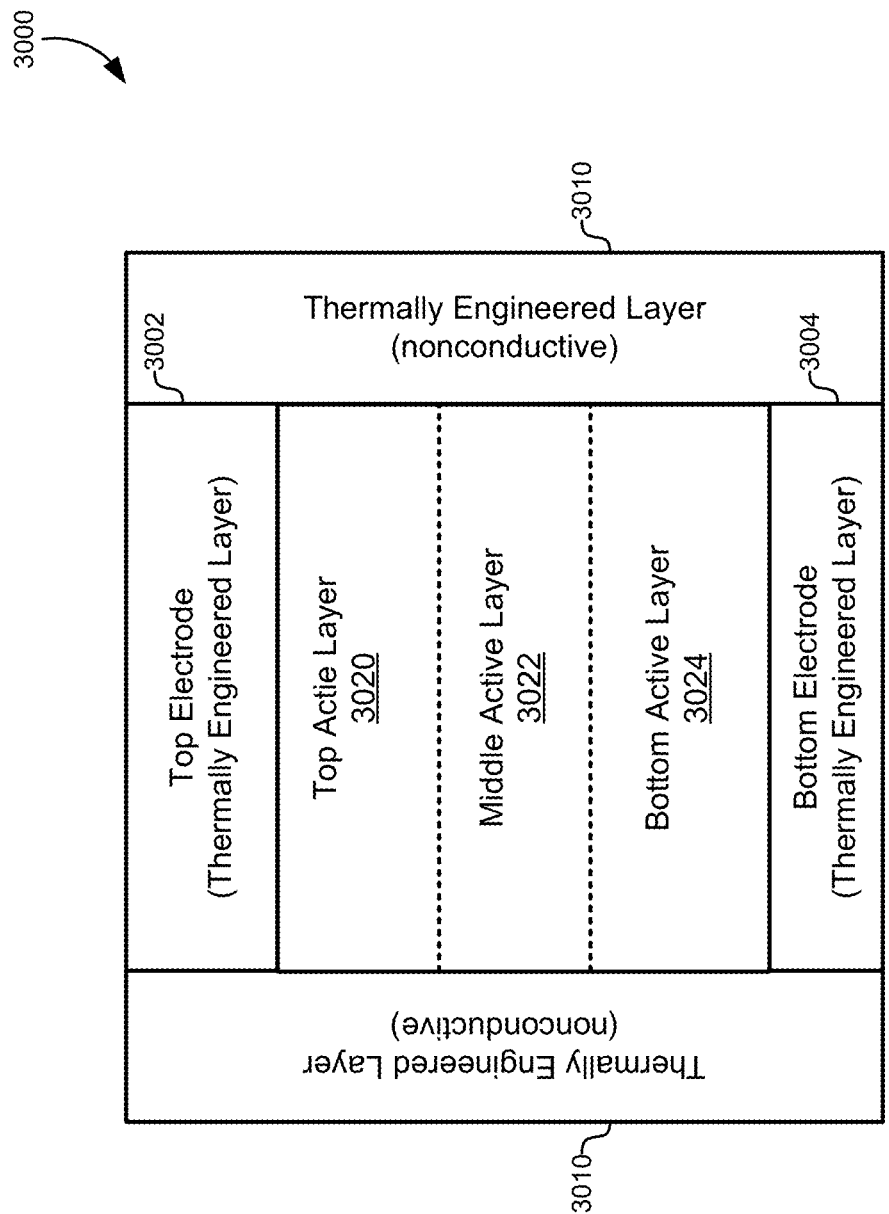
FIG. 30 illustrates a ReRAM device where the electrodes act as thermally engineered layers along with a separate thermally engineered layer wrapped around the ReRAM device, according to some embodiments.

FIG. 30 illustrates a ReRAM device 3000 where the electrodes act as thermally engineered layers along with a separate thermally engineered layer 3010 wrapped around the ReRAM device 3000, according to some embodiments. The top electrode 3002 and/or the bottom electrode 3004 may use materials that act as a thermally engineered layer as illustrated and described above in relation to FIG. 11. A thermally engineered layer 3010 may also be wrapped around the active layer and the electrodes 3002, 3004 as illustrated and described above in relation to FIG. 11. The ReRAM device 3000 may also divide the active layer into a top active layer 3020, a middle active layer 3022, and a bottom active layer 3024. These layers 3020, 3022, 3024 in the active layer may be configured as illustrated and described above in relation to FIG. 17 based on dielectric constants to slow formation of the filament in the active layers 3022, 3024 and 3026.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A method of fabricating a resistive random-access memory (ReRAM) device, the method comprising:
    forming a first electrode comprising a first conductive material;
    forming an active layer comprising an oxide material and configured to form a conductive filament in the active layer in response to an applied voltage; and
    forming a thermally engineered layer having a thermal conductivity greater than approximately 0.8 W/cmK, wherein the thermally engineered layer is positioned adjacent to the active layer and the thermally engineered layer is nonconductive.

2. The method of claim 1, wherein the thermally engineered layer is positioned between the active layer and the first electrode.

3. The method of claim 1, wherein the active layer comprises a first side that is adjacent to the first electrode, and wherein the active layer comprises a second side that is approximately orthogonal to the first side and adjacent to the thermally engineered layer.

4. The method of claim 3, wherein the thermally engineered layer is deposited such that it wraps around the active layer.

5. The method of claim 3, further comprising forming a gap between the thermally engineered layer and the first electrode.

6. The method of claim 1, further comprising forming a second thermally engineered layer having a second thermal conductivity greater than approximately 0.8 W/cmK, wherein the thermally engineered layer is positioned adjacent to a first side of the active layer, and wherein the second thermally engineered layer is positioned adjacent to a second side of the active layer.

7. The method of claim 1, further comprising forming a via that passes through the thermally engineered layer to electrically contact the first electrode.

8. The method of claim 1, wherein the thermally engineered layer comprises a cylinder, and the active layer comprises a layer wrapped around the cylinder.

9. The method of claim 1, wherein the thermally conductivity of the thermally engineered layer is at least 10 times greater than a thermal conductivity of the active layer.

10. The method of claim 1, wherein the thermally engineered layer wraps around the active layer, the first electrode, and the second electrode.

11. The method of claim 1, wherein the active layer comprises:
    a first layer comprising a first material having a first dielectric constant;
    a second layer comprising a second material having a second dielectric constant; and
    a third layer comprising a third material having a third dielectric constant, wherein the second active layer is positioned between the first active layer and the third active layer.

12. A method of fabricating a resistive random-access memory (ReRAM) device, the method comprising:
    forming a first electrode;
    forming a first active layer comprising a first material having a first dielectric constant;
    forming a second active layer comprising a second material having a second dielectric constant, wherein the second dielectric constant is higher than the first dielectric constant;
    forming a third active layer comprising a third material having a third dielectric constant, wherein the second active layer is positioned between the first active layer and the third active layer, and the second dielectric constant is higher than the third dielectric constant; and
    forming a second electrode, wherein the first active layer, the second active layer, and the third active layer are positioned between the first electrode and the second electrode.

13. The method of claim 12, wherein the first material and the third material comprise $Ta_2O_5$.

14. The method of claim 12, wherein the third material comprises $TaO_x$, Ta, Ti, or $TiO_x$.

15. The method of claim 12, wherein the second material comprises a uniform distribution of defects.

16. A method of fabricating a resistive random-access memory (ReRAM) device, the method comprising:
    forming a first electrode;
    forming a first active layer comprising a first material having a first dielectric constant;
    forming a second active layer comprising a second material having a second dielectric constant;
    forming a third active layer comprising a third material having a third dielectric constant, wherein the second active layer is positioned between the first active layer and the third active layer; and
    forming a thermally engineered layer having a thermal conductivity greater than approximately 0.8 W/cmK, wherein the thermally engineered layer is positioned adjacent to at least one of the first active layer, the second active layer, or the third active layer, and the thermally engineered layer wraps around the first active layer, the second active layer, and the third active layer.

17. The method of claim 16, wherein the thermally engineered layer is adjacent to each of the first active layer, the second active layer, and the third active layer.

18. The method of claim 16, wherein the thermally engineered layer is further positioned between the first active layer and the first electrode.

19. The method of claim 16, wherein the thermally engineered layer further acts as a second electrode on the ReRAM device, such that the first active layer, the second active layer, and the third active layer are positioned between the thermally engineered layer and the first electrode.

\* \* \* \* \*